(12) United States Patent
Oh et al.

(10) Patent No.: US 12,045,496 B2
(45) Date of Patent: Jul. 23, 2024

(54) SEMICONDUCTOR MEMORY DEVICE AND METHOD PROVIDING LOG INFORMATION

(71) Applicant: SAMSUNG ELECTRONICS CO., LTD., Suwon-si (KR)

(72) Inventors: Boayeong Oh, Hwaseong-si (KR); Kwanghyun Kim, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 207 days.

(21) Appl. No.: 17/706,324

(22) Filed: Mar. 28, 2022

(65) Prior Publication Data

US 2023/0112719 A1     Apr. 13, 2023

(30) Foreign Application Priority Data

Oct. 8, 2021     (KR) .................. 10-2021-0133697

(51) Int. Cl.
*G06F 11/00* (2006.01)
*G06F 3/06* (2006.01)

(52) U.S. Cl.
CPC .......... *G06F 3/0655* (2013.01); *G06F 3/0604* (2013.01); *G06F 3/0679* (2013.01)

(58) Field of Classification Search
CPC ..... G06F 3/0655; G06F 3/0604; G06F 3/0679
See application file for complete search history.

(56) References Cited

U.S. PATENT DOCUMENTS

| | | |
|---|---|---|
| 6,791,877 B2 | 9/2004 | Miura et al. |
| 7,200,021 B2 | 4/2007 | Raghuram |
| 7,478,290 B2 | 1/2009 | Co et al. |
| 8,238,134 B2 | 8/2012 | Matsui et al. |
| 9,087,613 B2 | 7/2015 | Sohn et al. |
| 2005/0080581 A1 | 4/2005 | Zimmerman et al. |
| 2019/0259465 A1* | 8/2019 | Subramanian ......... G11C 29/38 |
| 2021/0096774 A1* | 4/2021 | Han ..................... G06F 3/0659 |
| 2021/0200464 A1* | 7/2021 | Keeth ................ G11C 29/1201 |
| 2023/0072766 A1* | 3/2023 | Schaefer ............... G06F 11/073 |

* cited by examiner

*Primary Examiner* — Christine T. Tu
(74) *Attorney, Agent, or Firm* — Fish & Richardson P.C.

(57) ABSTRACT

A semiconductor memory device includes; a memory semiconductor die including a volatile memory device configured to perform a normal operation in response to at least one of a command and an address received from a host device, and a test chip vertically stacked with the memory semiconductor die and including a nonvolatile memory device. The test chip is configured in the normal mode to store log information corresponding to at least one of a command and an address received by the semiconductor memory device from the host device, and is further configured in a debugging mode to read the log information from the nonvolatile memory device.

19 Claims, 22 Drawing Sheets

| LOGICAL ADDRESS | PHYSICAL ADDRESS |
|---|---|
| LA1 | PA1 |
| LA2 | PA2 |
| LA3 | PA3 |
| LA4 | ERASED |
| LA5 | ERASED |
| ⋮ | ⋮ |
| LAk | ERASED |

FIG. 16

ROW COMMAND

| CMD | CK R or F | R0 | R1 | R2 | R3 | R4 | R5 | R6 | R7 | R8 | R9 |
|---|---|---|---|---|---|---|---|---|---|---|---|
| RNOP | R | H | H | H | H | V | V | V | V | V | V |
| ACT | F | L | H | H | H | SID0/V | SID1/V | BA0 | BA1 | BA2 | BA3 |
|  | R | H | H | H | PC | RA10 | RA11 | RA12 | RA13/V | RA14/V | RA15/V |
|  | R | H | H | RA0 | RA1 | RA2 | RA3 | RA4 | RA5 | RA6 | RA7 |
| PDE | R | L | H | L | H | V | V | V | V | V | V |
|  | F | L | H | L | H | V | V | V | V | V | V |
| SRE | R | L | H | L | L | V | V | V | V | V | V |
|  | F | L | H | L | L | V | V | V | V | V | V |
| PDX/SRX | R | H | H | H | H | V | V | V | V | V | V |

FIG. 17

COLUMN COMMAND

| CMD | CK | C0 | C1 | C2 | C3 | C4 | C5 | C6 | C7 |
|---|---|---|---|---|---|---|---|---|---|
| CNOP | R | H | H | H | V | V | V | V | V |
|  | F | V | V | V | V | V | V | V | V |
| RD | R | H | L | H | L | PC | SID0/V | SID1/V | BA0 |
|  | F | BA1 | BA2 | BA3 | CA0 | CA1 | CA2 | CA3 | CA4 |
| WR | R | H | L | L | L | PC | SID0/V | SID1/V | BA0 |
|  | F | BA1 | BA2 | BA3 | CA0 | CA1 | CA2 | CA3 | CA4 |
| MRS | R | L | L | L | MA4 | OP5 | OP6 | OP7 | MA0 |
|  | F | MA1 | MA2 | MA3 | OP0 | OP1 | OP2 | OP3 | OP4 |

SEMICONDUCTOR MEMORY DEVICE AND METHOD PROVIDING LOG INFORMATION

CROSS-REFERENCE TO RELATED APPLICATION

This U.S. non-provisional application claims priority under 35 USC § 119 to Korean Patent Application No. 10-2021-0133697 filed on Oct. 8, 2021 in the Korean Intellectual Property Office, the subject matter of which is hereby incorporated by reference in its entirety.

BACKGROUND

1. Technical Field

The inventive concept relates generally to semiconductor integrated circuits, and more particularly to semiconductor memory devices and methods of providing log information.

2. Discussion of the Related Art

Generally, the circuitry of semiconductor memory devices (e.g., dynamic random access memories (DRAMs)) may be tested using various test benches to detect and identify faults at both the wafer level and package level. However, 100% testing cannot practically be performed on every semiconductor memory device, so it is possible that certain semiconductor memory devices may operate errantly even after having successfully passing all testing.

For a semiconductor memory device attached to a printed circuit board (PCB), certain types of errors associated with dump results for signals on pins connecting the semiconductor memory device and the PCB may occur. The dump result may be obtained by (e.g.) probes of a logic analyzer connected to the pins.

The testing of DRAMs may be expanded such that DRAMs may be applied to various devices and systems such as server systems, personal computers (PCs), mobile devices, automotive driving systems, etc. However, the various environments in which the DRAMs are mounted may cause different workload and this may lead to failure of the DRAM that cannot reasonably be predicted and screened using currently testing approaches.

SUMMARY

Embodiments of the inventive concept provide semiconductor memory devices exhibiting improved testing and operational performance, as well as methods of efficiently providing log information in relation to semiconductor memory devices.

According to some embodiments, a semiconductor memory device includes a memory semiconductor die connected to a host device and including a volatile memory device and memory input/output pads, wherein the volatile memory device performs a normal operation in response to at least one of a command and an address received in a normal mode from the host device through memory control pads among the memory input/output pads, and a test chip including a nonvolatile memory device and test input/output pads respectively connected to the memory input/output pads. In the normal mode, the test chip is configured to store log information in the nonvolatile memory device, and in a debugging mode the test chip is configured to read the log information from the nonvolatile memory device and output the log information through test data pads among the test input/output pads, and the log information includes information corresponding at least one of a command and an address received by the semiconductor memory device from the host device.

According to some embodiments, a semiconductor memory device includes; a memory semiconductor die including a volatile memory device configured to perform a normal operation in response to at least one of a command and an address received from a host device, and a test chip vertically stacked with the memory semiconductor die and including a nonvolatile memory device. The test chip is configured in the normal mode to store log information corresponding to at least one of a command and an address received by the semiconductor memory device from the host device, and further configured in a debugging mode to read the log information from the nonvolatile memory device.

According to some embodiments, a method of providing log information includes; in a normal mode, performing a normal operation by a volatile memory device included in a memory semiconductor die in response to at least one of a command and an address received from a host device, and storing log information in a nonvolatile memory device included in a test chip, wherein the log information corresponds to the at least one of a command and an address received from the host device; and in a debugging mode, stopping the normal operation of the volatile memory device; and reading the log information from the nonvolatile memory device.

BRIEF DESCRIPTION OF THE DRAWINGS

Advantages, benefits, features and related aspects of the inventive concept may be clearly understood upon consideration of the following detailed description together with the accompanying drawings, in which;

FIGS. 16 and 17 are respective, conceptual diagrams illustrating commands of a semiconductor memory device according to embodiments of the inventive concept;

DETAILED DESCRIPTION

Throughout the written description and drawings, like reference numbers and labels are used to denote like or similar elements, components, method steps and/or features.

Figure (FIG.) 1 is a block diagram illustrating a system according to embodiments of the inventive concept.

Figure 1:
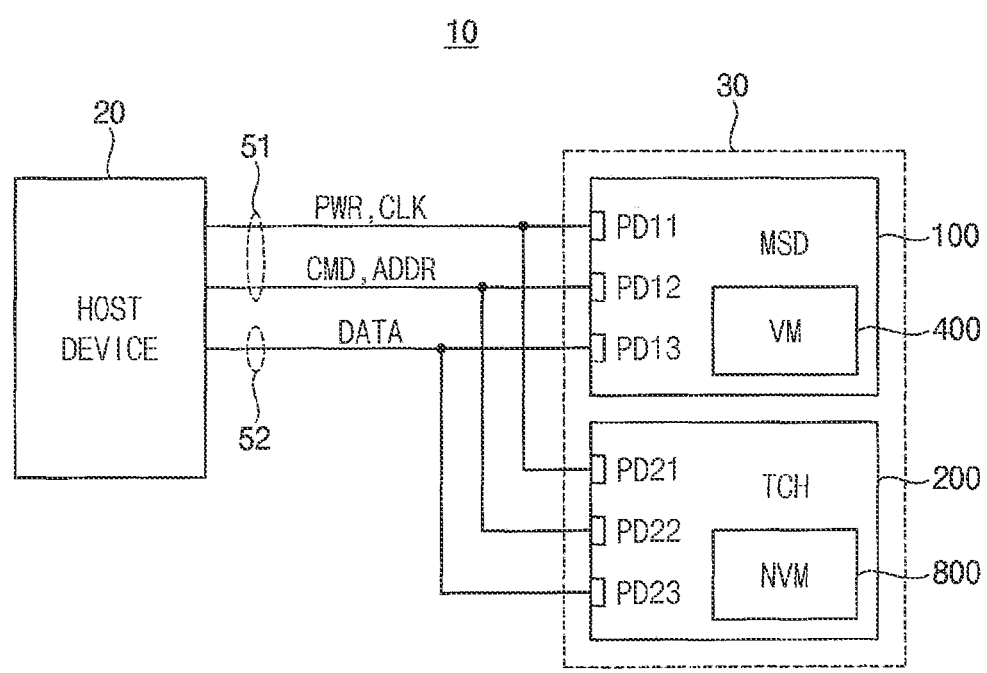
FIG. 1 is a block diagram illustrating a system according to embodiments of the inventive concept.

Referring to FIG. 1, a memory system 10 generally includes a host device 20 and a semiconductor memory device 30. The host device 20 and the memory device 30 may include respective interfaces enabling the sending and/or receiving (hereafter, "communication" or "communicating") of command/control signals (CMD), power signals (PWR), clock signals (CLK), address signals (ADDR) through a control bus 51, and the communication of data signals (DATA) through a data bus 52.

The host device 20 may generate various commands CMD that control the operation of the semiconductor memory device 30, such that data may be written to and/or read from the memory device 30 under the control of the host device 20. In this regard and consistent with established technical standards familiar to those skilled in the art, address(es) ADDR may be incorporated in one or more command(s) CMD.

The semiconductor memory device 30 may include a memory semiconductor die MSD 100 and a test chip TCH 200. As described hereafter in some additional detail with reference to FIG. 3, the memory semiconductor die 100 and the test chip 200 may be vertically stacked one on top of the other, and packaged as a single semiconductor chip.

The memory semiconductor die 100 of FIG. 1 is assumed to include a volatile memory device (VM) 400, such as a DRAM. Further, the memory semiconductor die 100 of FIG. 1 is assumed to include three (3) memory input-output (I/O) pads PD11, PD12 and PD13 connecting to the host device 20 to the VM 400. However, those skilled in the art will recognize that the particular choice volatile memory type for the VM 400 as well as the number and arrangement of memory I/O pads are matters of design choice.

In some embodiments, the memory I/O pads PD11, PD12 and PD13 may include memory voltage-clock pads PD11, memory control pads PD12 and memory data pads PD13, wherein each one of the memory voltage-clock pads PD11, the memory control pads PD12 and the memory data pads PD13 may include one or more pad(s).

The VM 400 may receive at least power signal(s) PWR and clock signal(s) CLK from the host device 20 through the memory voltage-clock pads PD11. The VM 400 may receive at least command signal(s) CMD and address signal(s) ADDR from the host device 20 through the memory control pads PD12, and the VM 400 may communicate at least data signal(s) with the host device 20 through the memory data pads PD13. In this regard, exemplary configuration(s) and operation(s) of the VM 400 will be described in some additional detail hereafter with reference to FIGS. 14 and 15.

The test chip 200 may include a nonvolatile memory device (NVM) 800, as well as test I/O pads PD21, PD22 and PD23 connecting the host device 20 and the NVM 800.

In some embodiments, the test I/O pads PD21, PD22 and PD23 may include test voltage-clock pads PD11, test control pads PD12 and test data pads PD13, wherein each one of the test voltage-clock pads PD21, the test control pads PD22 and the test data pads PD23 may include one or more pad(s).

The test chip 200 may receive at least power signal(s) PWR and clock signal(s) CLK from the host device 20 through the test voltage-clock pads PD21. The test chip 200 may receive at least command signal(s) CMD and address signal(s) ADDR from the host device 20 through the test control pads PD22, and the test chip 200 may communicate at least data signal(s) with the host device 20 through the test data pads PD23. In this regard, exemplary configuration(s) and operation(s) of the test chip 200 will be described hereafter in some additional detail with reference to FIGS. 4, 5 and 6, and exemplary configuration(s) and operation(s) of the NVM 800 will be described hereafter in some additional detail with reference to FIGS. 18, 19 and 20.

In some embodiments, the test I/O pads PD21, PD22 and PD23 may be respectively connected to the memory I/O pads PD11, PD12 and PD13. That is, the test voltage-clock pads PD21 may be respectively connected to the memory voltage-clock pads PD11, the test control pads PD22 may be respectively connected to the memory control pads PD12, and the test data pads PD23 may be respectively connected to the memory data pads PD13. In some embodiments, the number of the test voltage-clock pads PD21 may be equal to the number of the memory voltage-clock pads PD11, the number of the test control pads PD22 may be equal to the number of the memory control pads PD12, and the number of test data pads PD23 may be les than or equal to the number of the memory data pads PD13. When the number of test data pads PD23 is less than the number of the memory data pads PD13, some of the memory data pads PD13 may not be connected to the test data pads PD23.

Through these various pad connections, both the VM 400 of the memory semiconductor die 100 and the NVM 800 of the test chip 200 may simultaneously receive at least power signal(s) PWR, command signal(s) CMD and address signal(s) ADDR.

The memory system 10 may operate selectively in a normal mode or in a debugging mode.

In the normal mode, the VM 400 may perform normal operations, such as for example, write operations, read operations, erase operations, refresh operations, etc., in response to various commands CMD and addresses ADDR received from the host device 20 through the memory control pads PD12. Further in normal mode, the test chip 200 may store log information (e.g., information corresponding to received command(s) CMD and/or address(es)

ADDR—hereafter singularly of collectively denoted by the term "command/address") and store the log information in the NVM device 800.

In the debugging mode, the test chip 200 may read the log information from the NVM 800 to variously output the log information through the test data pads PD23.

Figure 2:
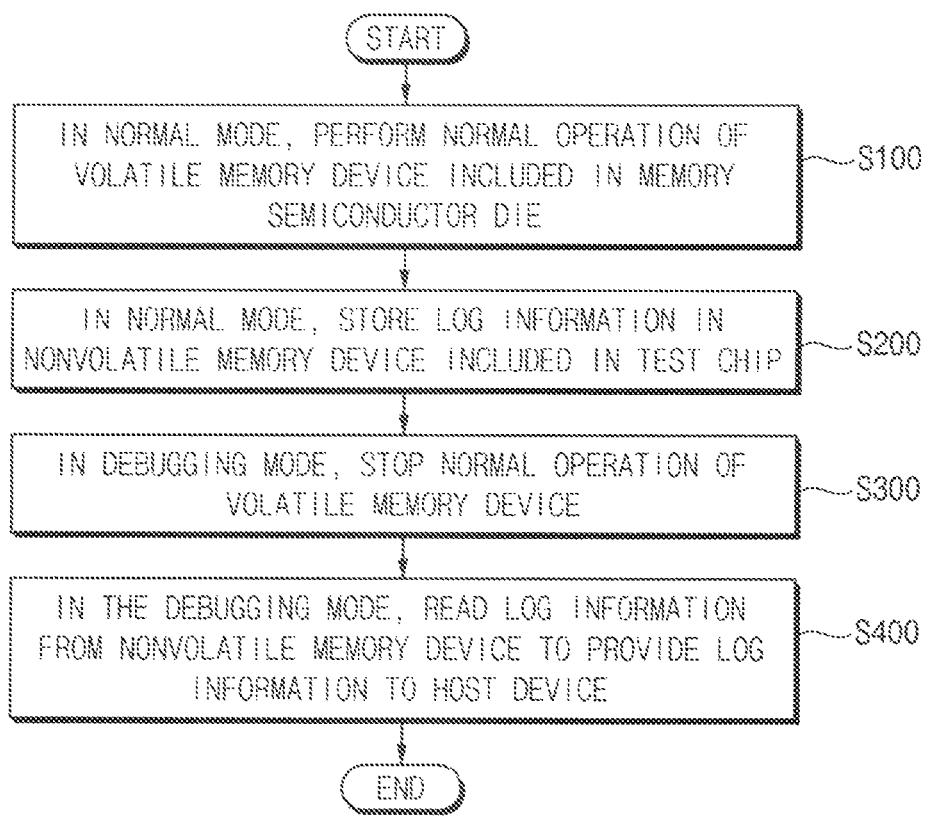
FIG. 2 is a flow chart illustrating a method of providing log information according to embodiments of the inventive concept.

FIG. 2 is a flow chart illustrating a method of providing log information according to embodiments of the inventive concept.

Referring to FIGS. 1 and 2, in the normal mode, one or more normal operation(s) of the VM 400 included in the memory semiconductor die 100 may be performed (e.g.) in response to command/address received from the host device 20 (S100). Further, in the normal mode, log information (e.g., information corresponding to command/address) may be stored in the NVM 800 of the test chip 200 (S200).

In the debugging mode, normal operation of the VM 400 may be stopped (S300), and the log information may be read from the NVM 800 and variously communicated (e.g., to the host device 20 (S400).

Operation of the memory system 10 in the normal mode and the debugging mode will be described hereafter in some additional detail with reference to FIGS. 5 and 6.

Figure 3:
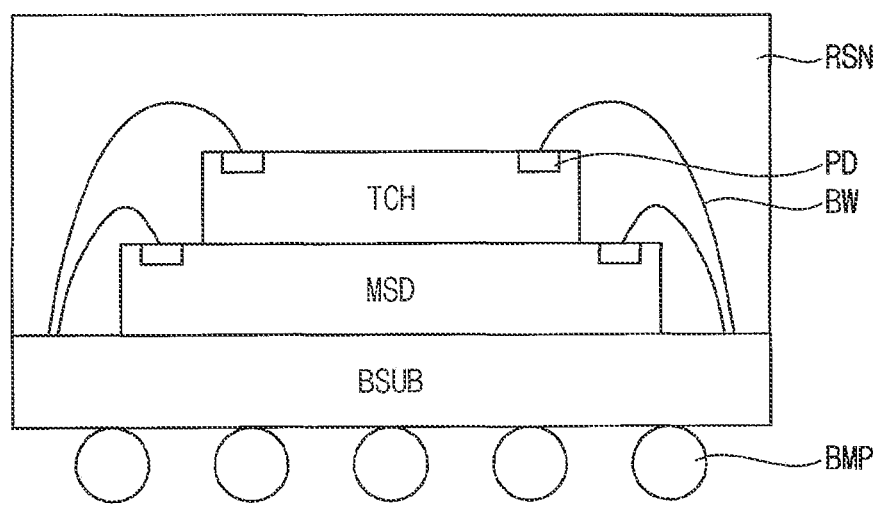
FIG. 3 is a cross-sectional diagram illustrating a semiconductor memory device according to embodiments of the inventive concept.

FIG. 3 is a cross-sectional diagram illustrating a semiconductor memory device 31 according to embodiments of the inventive concept.

Referring to FIG. 3, the semiconductor memory device 31 may include a base substrate BSUB, a memory semiconductor die MSD and a test chip TCH mounted on (e.g., mechanically assembled and/or electrically connected to) the base substrate BSUB. As such, the memory semiconductor die MDS and the test chip 200 may be vertically stacked and packaged as a single semiconductor chip. (In this context, the term "vertical" or "vertically" denotes a direction (e.g., a Z-axis) substantially orthogonal to an arbitrarily selected horizontal plane, such as a horizontal plane corresponding to the major axes (e.g., an X-axis and a Y-axis) of a semiconductor device or semiconductor substrate).

The base substrate BSUB may be an interposer or may include the interposer. In some embodiments, the base substrate BSUB may be a PCB. External connecting elements such as conductive bumps BMP may be formed on a lower surface of the base substrate BSUB. Although not shown in FIG. 3, internal connecting elements such as conductive micro bumps may be formed on an upper surface of the base substrate BSUB. Pads PD associated with the memory semiconductor die MSD and the test chip TCH may be electrically connected to the conductive bumps BMP through bonding wires BW and printed conductive lines in the base substrate BSUB. The vertically stacked arrangement of the memory semiconductor die MSB and the test chip TCH may be collectively packaged (or encapsulated) using (e.g.) resin RSN.

Figure 4:
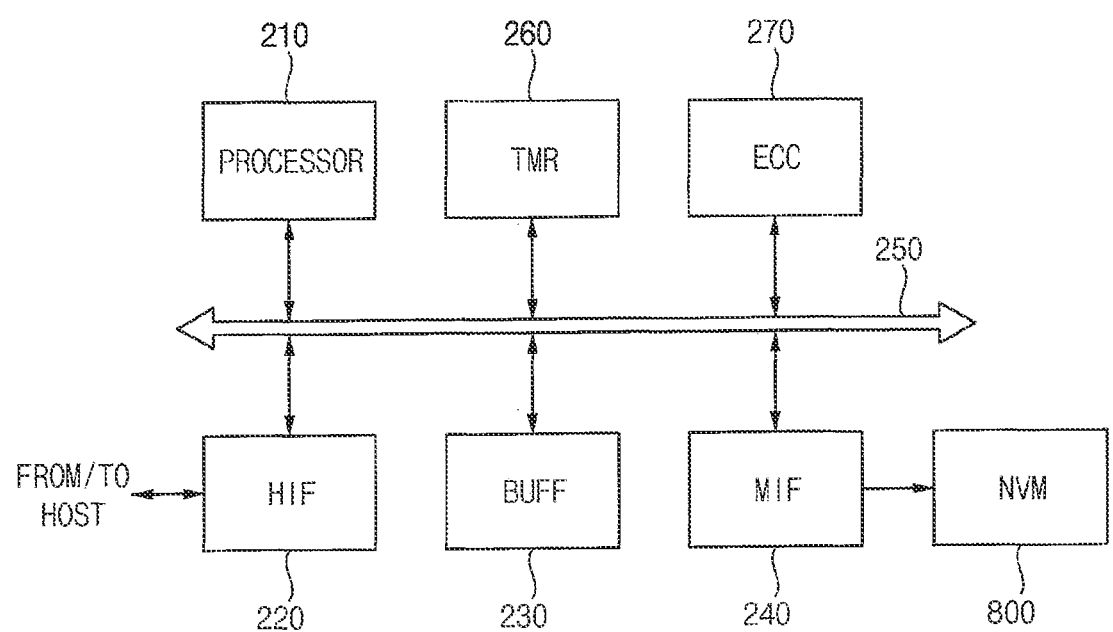
FIG. 4 is a block diagram further illustrating in one example the test chip of FIG. 1 according to embodiments of the inventive concept.

FIG. 4 is a block diagram further illustrating in one example the test chip 200 of FIG. 1 according to embodiments of the inventive concept.

Referring to FIGS. 1 and 4, the test chip 200 may include a processor 210, a host interface (HIF) 220, a buffer memory (BUFF) 230, a memory interface (MIF) 240, and an internal bus system 250 variously interconnecting components within the test chip 200. In some embodiments, the test chip 200 may further include a timer TMR 260 and/or an error correction code (ECC) engine 270.

The processor 210 may be used to control operation of the test chip 200. In some embodiments, the processor 210 may have a relatively simple configuration, such as one implemented using a field programmable gate array (FPGA), a special function register (SFR), a microprocessor, etc. The processor 210 may control the operation of the test chip 200 in response to a mode set register (MRS) command communicated from the host device 20, such that the test chip 200 may operate in either the normal mode or the debugging mode.

As noted above, in the normal mode the test chip 200 may store log information in the NVM 800. In some embodiments, the log information may include information corresponding to command/address communicated from the host device 20 through the test control pads PD22 respectively connected to the memory control pads PD12.

In the debugging mode, the test chip 200 may read the log information from the NVM 800 to provide (or output) the log information through the test data pads PD23 respectively connected to the memory data pads PD13.

Thus, the processor 210 may generate log information in the normal mode in response to command/address communicated through the host interface 220. The buffer memory 230 may temporarily store the log information before it is stored in the NVM 800. Additionally, the buffer memory 230 may store code codes and data used to control the operation of the processor 210. In some embodiments, the buffer memory 230 may be implemented using a volatile memory such as a static random access memory (SRAM), DRAM, etc.

The ECC engine 270 may be used to detect and/or correct errors in data being communicated using, for example, a coded modulation such as Bose-Chaudhuri-Hocquenghem (BCH) code, a low density parity check (LDPC) code, a turbo code, a Reed-Solomon code, a convolution code, a recursive systematic code (RSC), a trellis-coded modulation (TCM), a block coded modulation (BCM), etc. In some embodiments, the ECC engine 270 may perform ECC encoding and ECC decoding using one or more of the foregoing codes. For example, the ECC engine 270 may encode log information and store the resulting encoded log information in the NVM 800. Then, when the encoded log information is read from the NVM 800, the ECC engine 270 may be used to decode the encoded log information, thereby correcting as needed, and restoring the log information.

The timer 260 may be used to provide time information, such as real time clock (TTC). As described hereafter in relation to FIG. 10, the test chip 200 may store a time stamp as a portion of the log information using the time information provided by the timer 260. In this regard, the time stamp may indicate a time at which each command and/or each address of the command/address received from the host device 20. In some embodiments, time synchronization between the host device 20 and the VM 400 may be implemented. In such embodiments, the timer 260 may be used to provide time information that is synchronized with a time environment associated with the host device 20.

The HIF 220 may provide physical connections, signal level definitions and/or timing control compatible with one or more data communications protocols controlling the communication of signals between the host device 20 and the test chip 200. For example, the HIF 220 may be compatible with a bus format between the host device 20 and the VM 400, such as for example, a small computer system interface (SCSI), a serial attached SCSI (SAS) interface, a Universal Serial Bus (USB) interface, a peripheral component interconnect (PCI) express (PCIe) interface, an advanced technology attachment (ATA) interface, a parallel ATA (PATA) interface, a Serial ATA (SATA) interface, a NVM express (NVMe) interface, etc.

The MIF 240 may provide physical connections, signal level definitions and/or timing control compatible with one or more data communications protocols controlling the communication of data signals with the NVM 800. That is, the MIF 240 may control the communication of data in relation to the NVM 800. In some embodiments, the MIF 240 may be configured in accordance with commercially available technical standards, such as Toggle or open NAND flash interface (ONFI).

Figure 5:
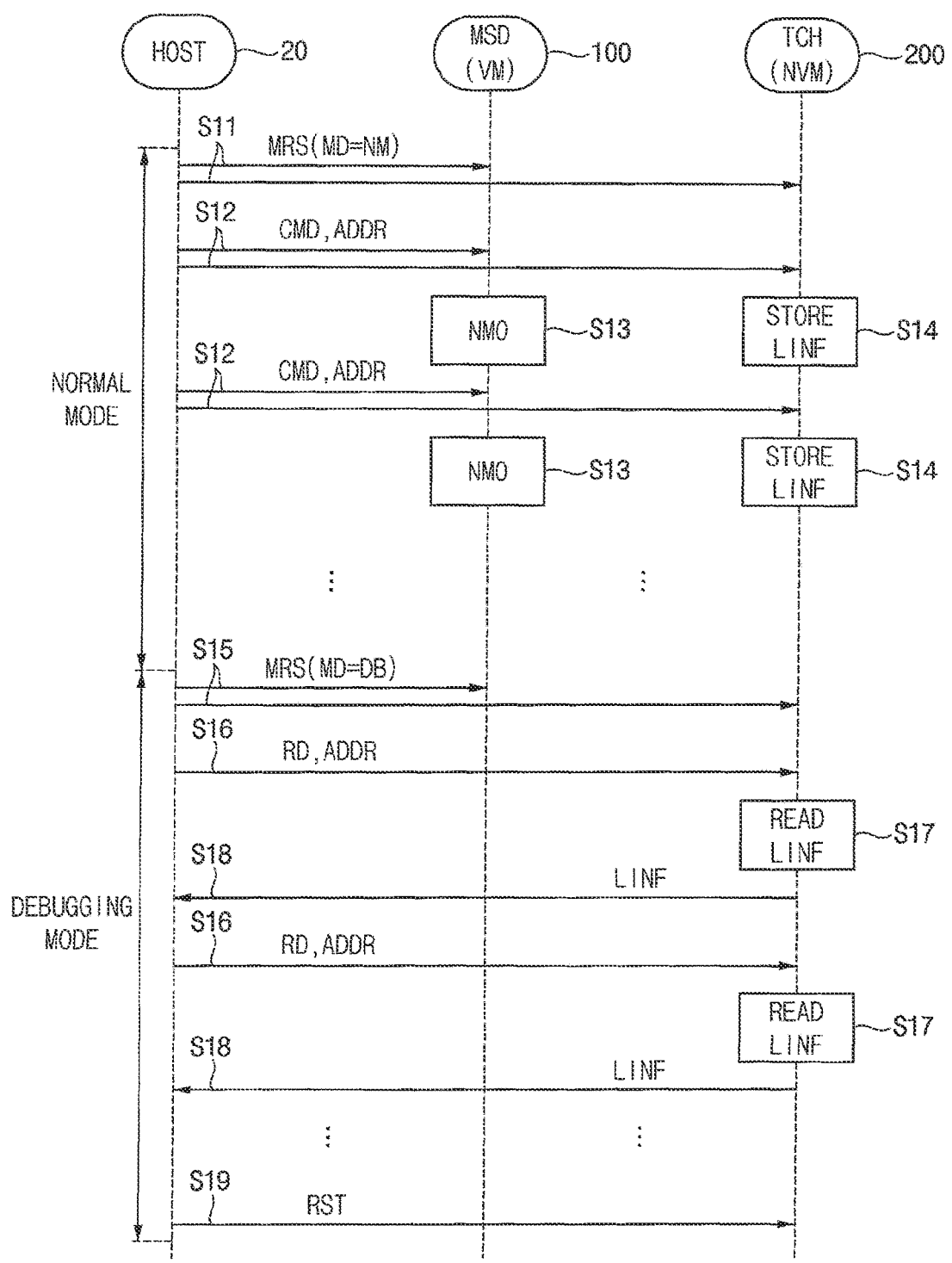
FIGS. 5 and 6 are respective flow diagrams illustrating operation of a semiconductor memory device according to embodiments of the inventive concept in a normal mode and a debugging mode.
Figure 6:
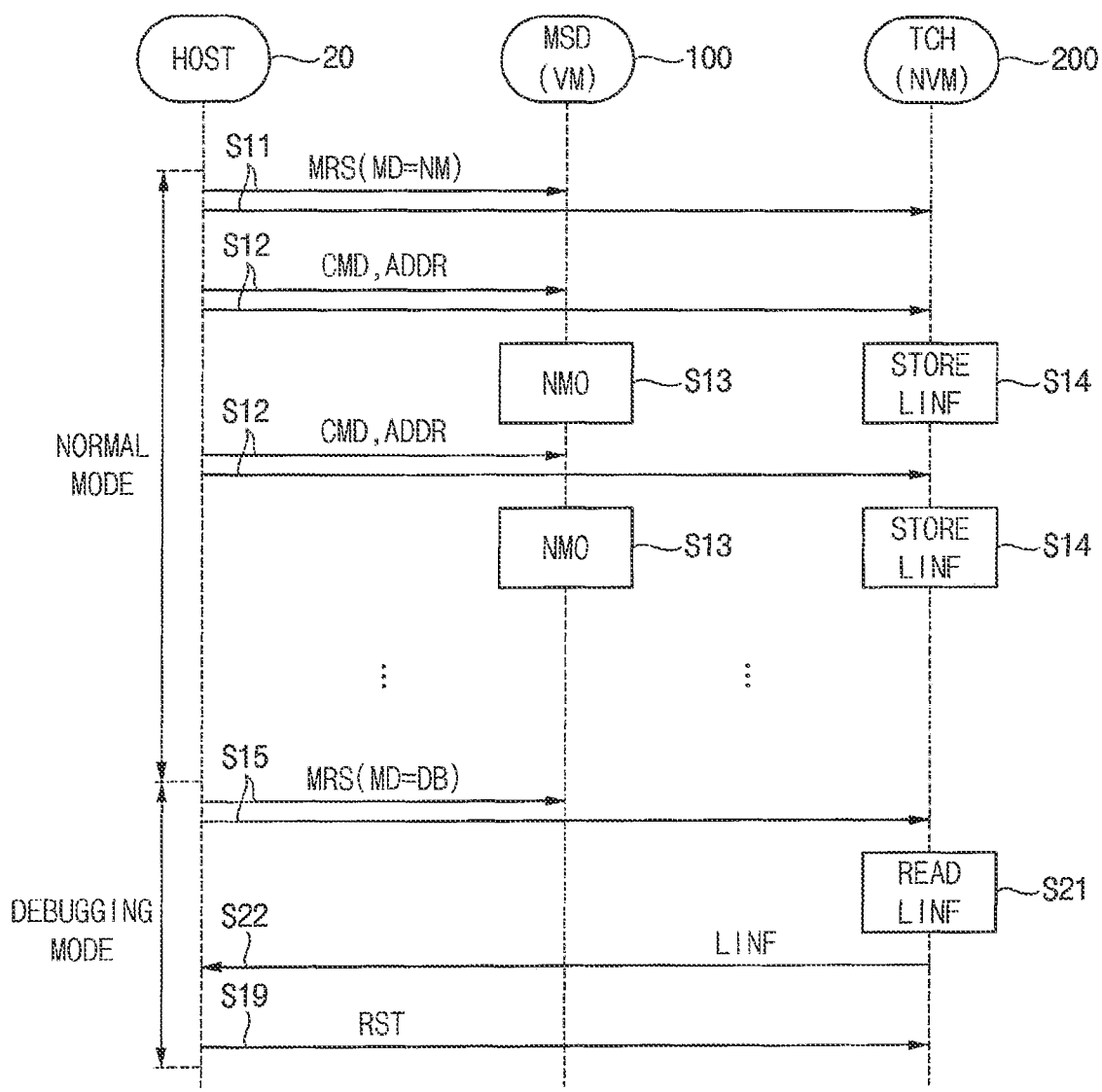

FIGS. 5 and 6 are flow diagrams variously illustrating operation of a semiconductor memory device according to embodiments of the inventive concept in the normal mode and the debugging mode.

Referring to FIGS. 1, 5 and 6, the memory semiconductor die MSD 100 including the VM 400 and the test chip TCH 200 including the NVM 800 may receive a mode set register (MRS) command including mode information MD corresponding to the normal mode NM from a host device 20 and enter the normal mode NM (S11). Alternately, the memory semiconductor die 100 and the test chip 200 may receive the MRS command including the mode information MD corresponding to a debugging mode DB and enter the debugging mode DB (S15).

The VM 400, as will be described hereafter in some additional detail with reference to FIG. 14, may include a mode register configured to store control values that control operation of the VM 400. Thus, the VM 400 may receive the MRS command including the mode information MD indicating the normal mode NM, or indicating the debugging mode DB, and store the mode information MD in the mode register. Accordingly, the VM 400 will operate in the normal mode NM or in the debugging mode DB in response to the mode information MD stored in the mode register.

The test chip 200 may operate in the normal mode NM or in the debugging mode DB in accordance with a mode register (e.g., the mode register of the VM 400), or in response to command/address communicated from the host device 20.

In the normal mode NM, the host device 20 may communicate the command/address, such that the VM 400 of the memory semiconductor die 100 and the test chip 200 may simultaneously receive the command/address ADDR (S12). The VM 400 may perform a normal operation NMO in response to the command/address (S13). In addition, the test chip 200 may store the command/address as the log information LINF independent of the performing (or execution) of the normal operation NMO by the VM 400 (S14).

The communication of the command/address (S12), the execution of the normal operation NMO in response to the command/address (S13), and the storing of the log information LINF (S14) may be repeatedly performed. In some embodiments, the test chip 200 may accumulate respective commands and/or addresses (as command/address) communicated from the host device 20 and then store the accumulated command/address as the log information LINF.

In the debugging mode DB, the VM 400 may stop the normal operation NMO in response to a command/address. For example, when the operating mode MD is the debugging mode DB, the VM 400 may ignore command(s) communicated from the host device 20, and instead, perform one or more operations responsive to other instructions, such as the MRS command.

In the debugging mode DB, the test chip 200 may read the log information LINF from the NVM 800 and communicate the read log information LINF to the host device 20 through the test data pads.

Referring to FIGS. 1 and 5, in some embodiments, the test chip 200 may receive a read command RD and a corresponding address ADDR from the host device 20 (S16), and read the log information LINF corresponding to the corresponding address (S17) and provide the read log information LINF to the host device 20 (S18). The communication of the read command RD and address ADDR (S16), reading of the log information LINF (S17) and the communication of the read log information LINF (S18) may be repeatedly performed by changing the address ADDR corresponding to the read operation until such time as all (or a desired portion) of the log information LINF has been successfully communicated to the host device 20.

Referring to FIGS. 1 and 6, in some embodiments, the test chip 200 may read the log information LINF from the NVM 800 (S21) and provide the read log information LINF to the host device 20 (S22), regardless of the command/address received from the host device 20. (Consistent with generally understood memory interfaces, data may be communicated from a memory device to a host device synchronously with (e.g.) a read data strobe signal communicated from the memory device to the host device). The test chip 200 may enable (e.g., toggle) the read data strobe signal to sequentially communicate the log information LINF. The test chip 200 may disable the read data strobe signal once all (or the desired portion) of the log information LINF has been successfully communicated to the host device 20.

In some embodiments, in the debugging mode DB, the host device 20 may communicate a reset command RST to the test chip 200 once the communication of the log information LINF has been completed (S19). The test chip 200 may initialize the NVM 800 by performing an erase operation in relation to the NVM 800 and in response to the reset command RST communicated from the host device 20 in the debugging mode DB. In addition, the test chip 200 may initialize a mapping table, as will be described hereafter in some additional detail with reference to FIG. 8, together with the initialization of the NVM 800.

Figures 7, 8:
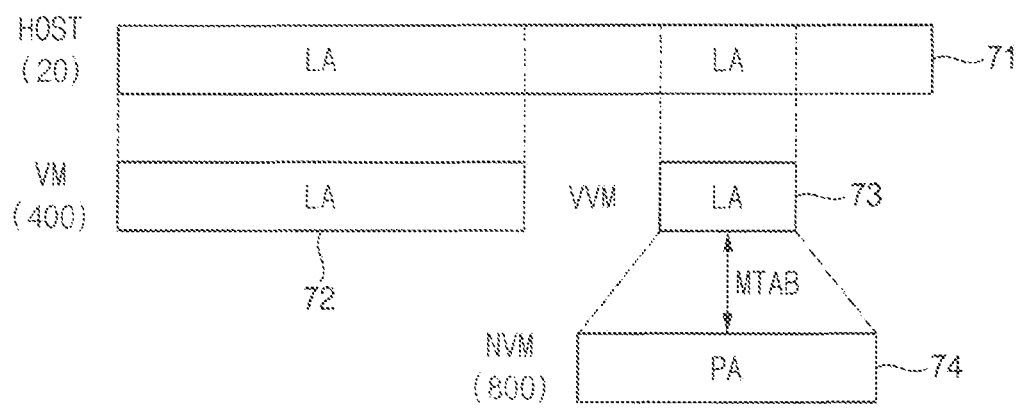
FIG. 7 is a conceptual diagram illustrating one assignment example for address space within a memory system according to embodiments of the inventive concept.
FIG. 8 is a conceptual diagram illustrating in one example a mapping table that may be used in the test chip of FIG. 1.

FIG. 7 is a conceptual diagram illustrating an address space of a memory system according to embodiments of the inventive concept, and FIG. 8 is a conceptual diagram illustrating in one example, a mapping table that may be used in the test chip 200 according to embodiments of the inventive concept.

Referring to FIGS. 1 and 7, the host device 20 may assign a first address region 72 to the VM 400, and a second address region 73 to a virtual volatile memory device (VVM) in a virtual address space 71 managed by the host device 20. The virtual address space 71, as well as the first and second address regions 72 and 73 may correspond to logical addresses LA. Thus, the second address region 73 may correspond to the VVM that exists only as a logical or mathematical construct within the computational capabilities or software resources of the host device 20.

Referring to FIGS. 1, 7 and 8, the test chip 200 may generate a mapping table MTAB including mapping relationship between a logical address LA of the host device and a physical address PA of the NVM 800, wherein the example of FIG. 8 assumes logical addresses LA1, LA2 and LA3 among a range of valid logical addresses (e.g., LA1~Lak, where 'k' is a natural number) mapped onto corresponding physical addresses PA1, PA2 and PA3. Here, physical addresses not mapped onto a corresponding logical addresses may indicate region(s) of the NVM 800 to be erased, recycled or otherwise subject to a housekeeping operation.

Thus, the test chip 200 may provide physical address(es) PA associated with memory space of the NVM 800 and corresponding to logical address(es) LA in accordance with the mapping table MTAB during read operations and write operations related to the log information LINF. In some embodiments, the test chip 200 may stop storing log information LINF when the test chip 200 determines, in accordance with the mapping table MTAB, that memory space of the NVM 800 is insufficient to store any additional log information LINF.

Figure 9:
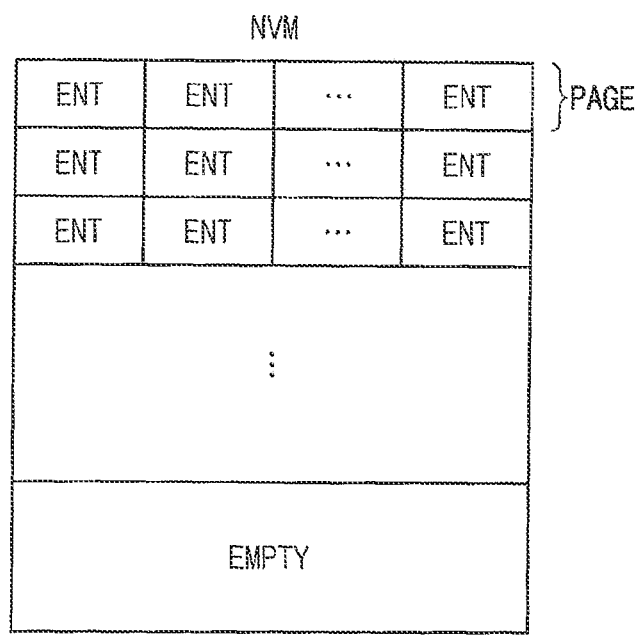
FIG. 9 is a conceptual diagram illustrating the storing of log information in the test chip 200 of FIG. 1.
Figure 10:
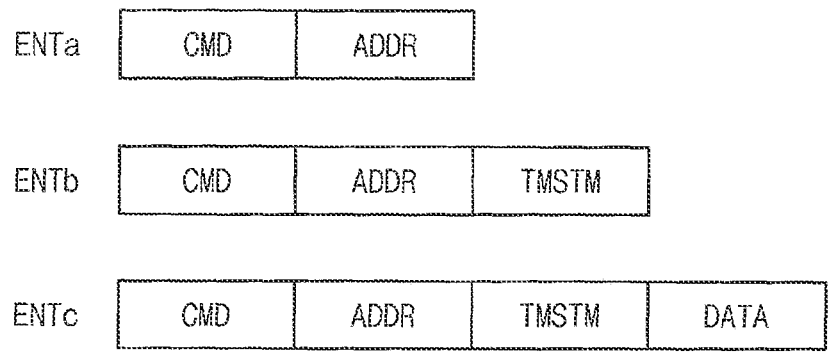
FIG. 10 is a conceptual diagram illustrating one approach to log entries that may be included in the log information.

FIG. 9 is a conceptual diagram illustrating the storing of log information in the test chip 200 according to embodiments of the inventive concept, and FIG. 10 is a conceptual diagram illustrating one approach to log entries included in the log information.

Referring to FIGS. 1, 4 and 9, the test chip 200 may generate one log entry ENT for each command CMD and/or address ADDR communicated from the host device 20. In some embodiments, the test chip 200 may store as the log information LINF multiple log entries ENT, as sequentially received.

The log information FINF, that is, the generated log entries ENT may be temporarily stored in the buffer memory 230 of the test chip 200. The buffer memory 230 may communicate the log information FINF to the NVM 800 in page units, wherein a "page" is a nominal unit used during write operations performed by the NVM 800. As shown in FIG. 9, each page may include the multiple log entries ENT. Thus the NVM 800 may perform the write operation (or program operations) in order to store the log information FINF on a page-by-page basis. In this manner, overly-frequent programming operations may be avoided and overall power consumption may be reduced in the test chip 200.

Referring to FIGS. 1, 4, 9 and 10, a log entry ENTa may include a command CMD and/or address ADDR corresponding to the command CMD. The command CMD and/or address stored in the log entry ENTa may be indicated by a number of bits received through the test control pads, or values generated by decoding the received bits.

In some embodiments, a log entry ENTb may further include a time stamp TMSTM. As described with reference to FIG. 4, the test chip 200 may include the timer 260 configured to provide time information. The test chip 200 may store the time stamp TMSTM as a portion of the log information LINF, such the time stamp indicates a time at which each command CMD and/or address ADDR was received.

In some embodiments, a log entry ENTc may further include data corresponding to at least a portion of data received through the test data pads during the normal mode. For example, particular data such as a data pattern used during a training procedure associated with the VM 400 may be included in the log entry ENTc. In this regard and as previously noted in relation to FIG. 1, the test data pads PD23 may be respectively connected to the memory data pads PD13, and the test chip 200 may store, as a portion of the log information LINF, at least a portion of the data received through the test data pads in the normal mode.

Figure 11:
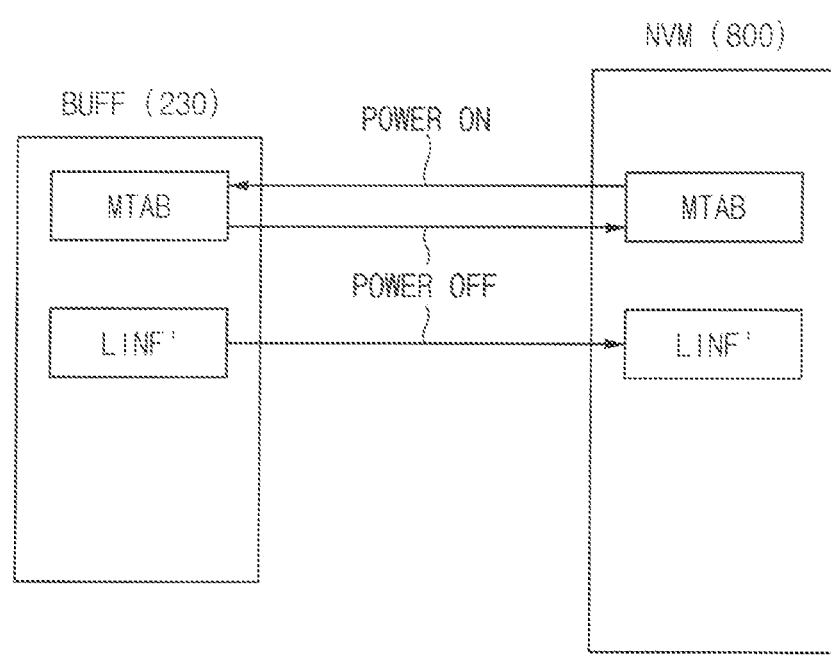
FIG. 11 is a block diagram illustrating a test chip included in a semiconductor memory device according to embodiments of the inventive concept.

FIG. 11 is a block diagram illustrating operation of a test chip included in a semiconductor memory device 10 according to embodiments of the inventive concept.

Referring to FIGS. 1, 4 and 11, the test chip 200 may store (or backup) the mapping table MTAB—which is stored in the buffer memory BUFF 230 during a power-ON state—in the NVM 800 before the semiconductor memory device 10 is powered OFF. Thereafter, the mapping table MTAB may be read from the NVM 800 once the semiconductor memory device 10 is again powered ON. In some embodiments, the read mapping table MTAB may be loaded to the buffer memory BUFF.

In some embodiments, when the semiconductor memory device 10 is powered OFF during normal mode, the buffer memory BUFF may store residual log information LINF' currently stored in the buffer memory BUFF in the NVM 800. Thereafter, the test chip 200 may be safely powered OFF once the NVM 800 has completed storing of the residual log information LINF'. Consistent with the foregoing description, the storing of the log information LINF may normally be performed to page units, however, the size of any residual log information LINF' may less than of equal to a page.

Figure 12:
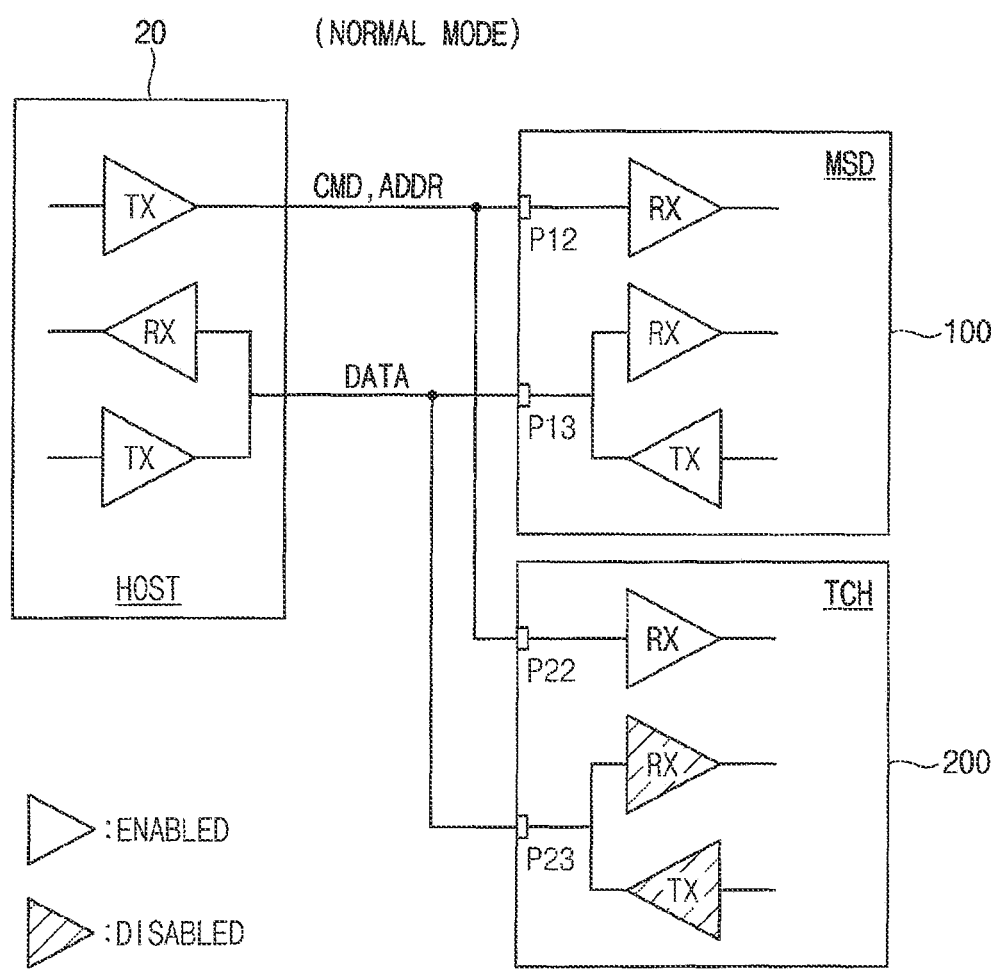
FIGS. 12 and 13 are respective block diagrams illustrating selective activation of I/O pads by operating modes in a semiconductor memory device according to embodiments of the inventive concept.
Figure 13:
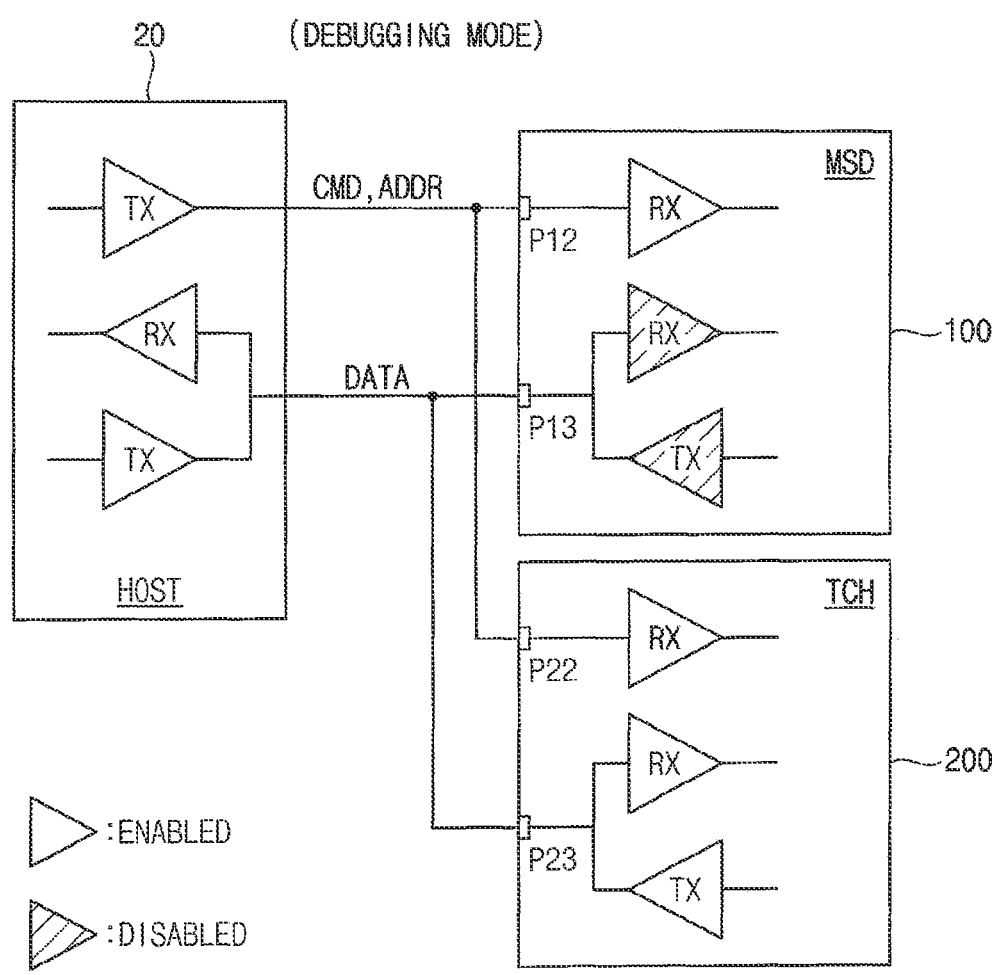

FIGS. 12 and 13 are respective diagrams illustrating selective activation of I/O pads depending on operating mode of a semiconductor memory device according to embodiments of the inventive concept.

Here, various transmitters TX and receivers RX associated with interface(s) of the host device 20, the memory semiconductor die MSD 100 and the test chip TCH 200 any conceptually illustrated. Each pad may be activated by enabling a corresponding transmitter TX and/or a corresponding receiver RX. And each pad may be deactivated by disabling the corresponding transmitter TX and/or the corresponding receiver RX.

Referring to FIGS. 1 and 12 in the normal mode, a volatile memory of the memory semiconductor die 100 may enable the transmitters TX and the receivers RX connected to the memory control pads P12 and the memory data pads P13 of the memory semiconductor die 100. Also in the normal mode, the test chip 200 may enable the receivers RX connected to the test control pads P22 and disable the receivers RX and the transmitters TX connected to the test data pads T23.

Referring to FIGS. 1 and 13 in the debugging mode, the volatile memory device of the memory semiconductor die 100 may enable the receivers RX connected to the memory control pads P12 and disable the receivers RX and the transmitters RX connected to the memory data pads P13. Also in the debugging mode, the test chip 200 may enable the receivers RX and the transmitters connected to the test control pads P22 and the test data pads T23.

Accordingly, the volatile memory device of the memory semiconductor die 100 may activate both of the memory control pads P12 and the memory data pads P13 in the normal mode. The volatile memory device may activate the memory control pads P12 and deactivate the memory data pads P13 in the debugging mode. The test chip 200 may activate the test control pads P22 and deactivate the test data pads P23 in the normal mode. The test chip 200 may activate both of the test control pads P22 and the test data pads P23 in the debugging mode.

Figure 14:
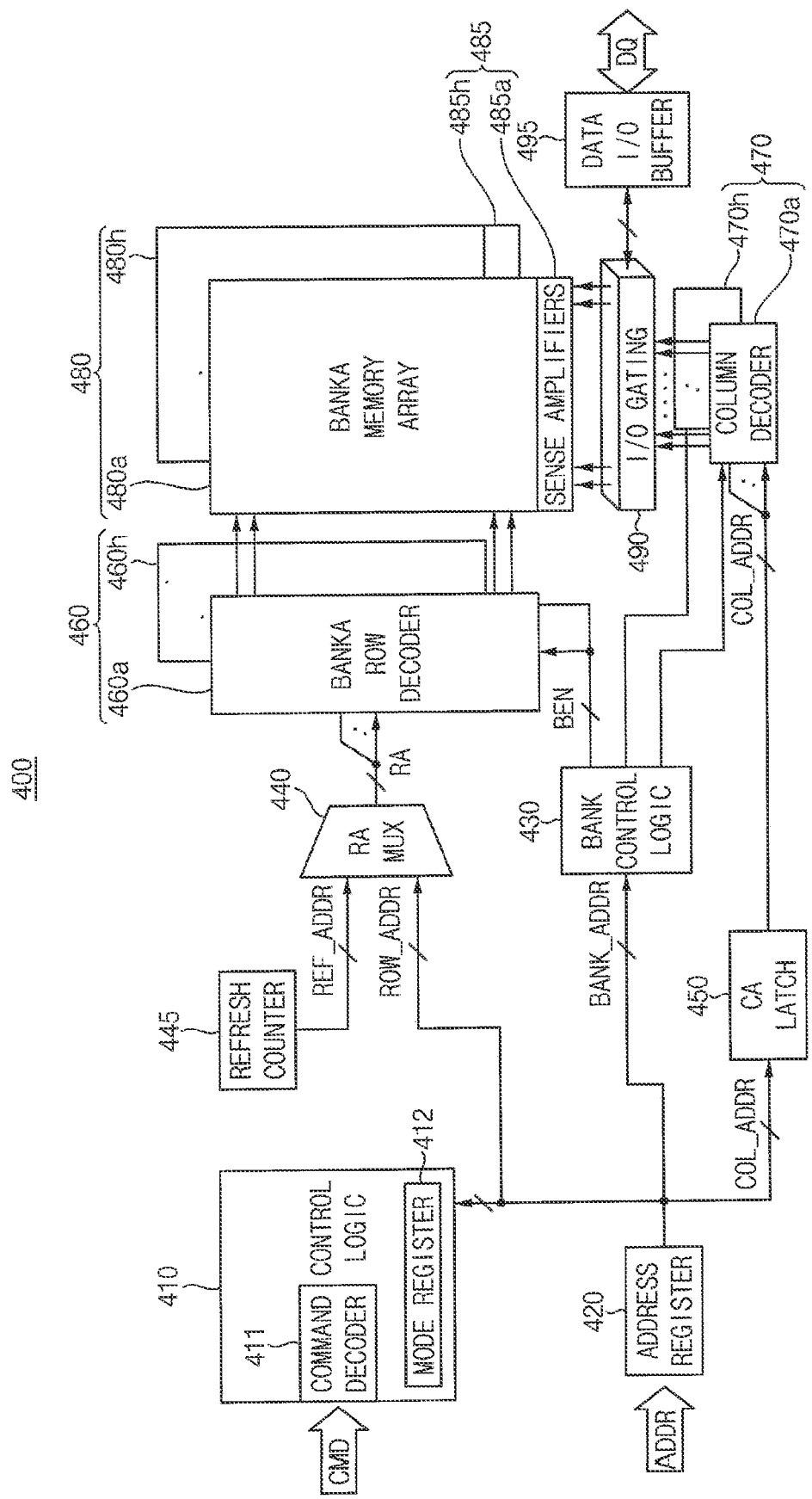
FIG. 14 is a block diagram illustrating a semiconductor memory device according to embodiments of the inventive concept.

FIG. 14 is a block diagram illustrating a semiconductor memory device according to embodiments of the inventive concept.

Referring to FIGS. 1 and 14, the semiconductor memory device—here assumed to be VM 400, but may alternately be another volatile memory device—may include a control logic 410, an address register 420, a bank control logic 430, a row address multiplexer 440, a column address latch 450, a row decoder 460, a column decoder 470, a memory cell array 480, a sense amplifier unit 485, an I/O gating circuit 490, a data I/O buffer 495, and a refresh counter 445.

The memory cell array 480 may include a plurality of bank arrays 480a~480h. The row decoder 460 may include a plurality of bank row decoders 460a~460h respectively coupled to the bank arrays 480a~480h, the column decoder 470 may include a plurality of bank column decoders 470a~470h respectively coupled to the bank arrays 480a~480h, and the sense amplifier unit 485 may include a plurality of bank sense amplifiers 485a~485h respectively coupled to the bank arrays 480a~480h.

The address register 420 may receive an address ADDR including a bank address BANK_ADDR, a row address ROW_ADDR and a column address COL_ADDR from a memory controller (not shown). The address register 420 may provide the received bank address BANK_ADDR to the bank control logic 430, may provide the received row address ROW_ADDR to the row address multiplexer 440, and may provide the received column address COL_ADDR to the column address latch 450.

The bank control logic 430 may generate bank control signals in response to the bank address BANK_ADDR. The bank control signals may include bank enable signals BEN to activate a selection memory bank corresponding to the bank address BANK_ADDR. One of the bank row decoders 460a~460h corresponding to the bank address BANK_ADDR may be activated in response to the bank control signals, and one of the bank column decoders 470a~470h corresponding to the bank address BANK_ADDR may be activated in response to the bank control signals.

The row address multiplexer 440 may receive the row address ROW_ADDR from the address register 420, and may receive a refresh row address REF_ADDR from the refresh counter 445. The row address multiplexer 440 may selectively output the row address ROW_ADDR or the refresh row address REF_ADDR as a row address RA. The row address RA that is output from the row address multiplexer 440 may be applied to the bank row decoders 460a~460h.

The activated one of the bank row decoders 460a~460h may decode the row address RA that is output from the row address multiplexer 440, and may activate a word-line corresponding to the row address RA. For example, the activated bank row decoder may apply a word-line driving voltage to the word-line corresponding to the row address RA.

The column address latch 450 may receive the column address COL_ADDR from the address register 420, and may temporarily store the received column address COL_ADDR. In some embodiments, in a burst mode, the column address latch 450 may generate column addresses that increment from the received column address COL_ADDR. The column address latch 450 may apply the temporarily stored or generated column address to the bank column decoders 470a~470h.

The activated one of the bank column decoders 470a~470h may decode the column address COL_ADDR that is output from the column address latch 450, and may control the I/O I/O gating circuit 490 in order to output data corresponding to the column address COL_ADDR.

The I/O gating circuit 490 may include a circuitry for gating input/output data. The I/O gating circuit 490 may further include read data latches for storing data that is output from the bank arrays 480a~480h, and write drivers for writing data to the bank arrays 480a~480h.

Data to be read from one bank array of the bank arrays 480a~480h may be sensed by the sense amplifier unit 485 coupled to the one bank array from which the data is to be read, and may be stored in the read data latches. The data stored in the read data latches may be provided to the memory controller via the data I/O buffer 495. Data DQ to be written in one bank array of the bank arrays 480a~480h may be provided to the data I/O buffer 495 from the memory controller. The write driver may write the data DQ in one bank array of the bank arrays 480a~480h.

The control logic 410 may control operations of the memory device 400. For example, the control logic 410 may generate control signals for the memory device 400 in order to perform a write operation or a read operation. The control logic 410 may include a command decoder 411 that decodes a command CMD received from the memory controller and a mode register set 412 that sets an operation mode of the memory device 400.

For example, the command decoder 411 may generate the control signals corresponding to the command CMD by decoding a write enable signal, a row address strobe signal, a column address strobe signal, a chip selection signal, etc.

Figure 15:
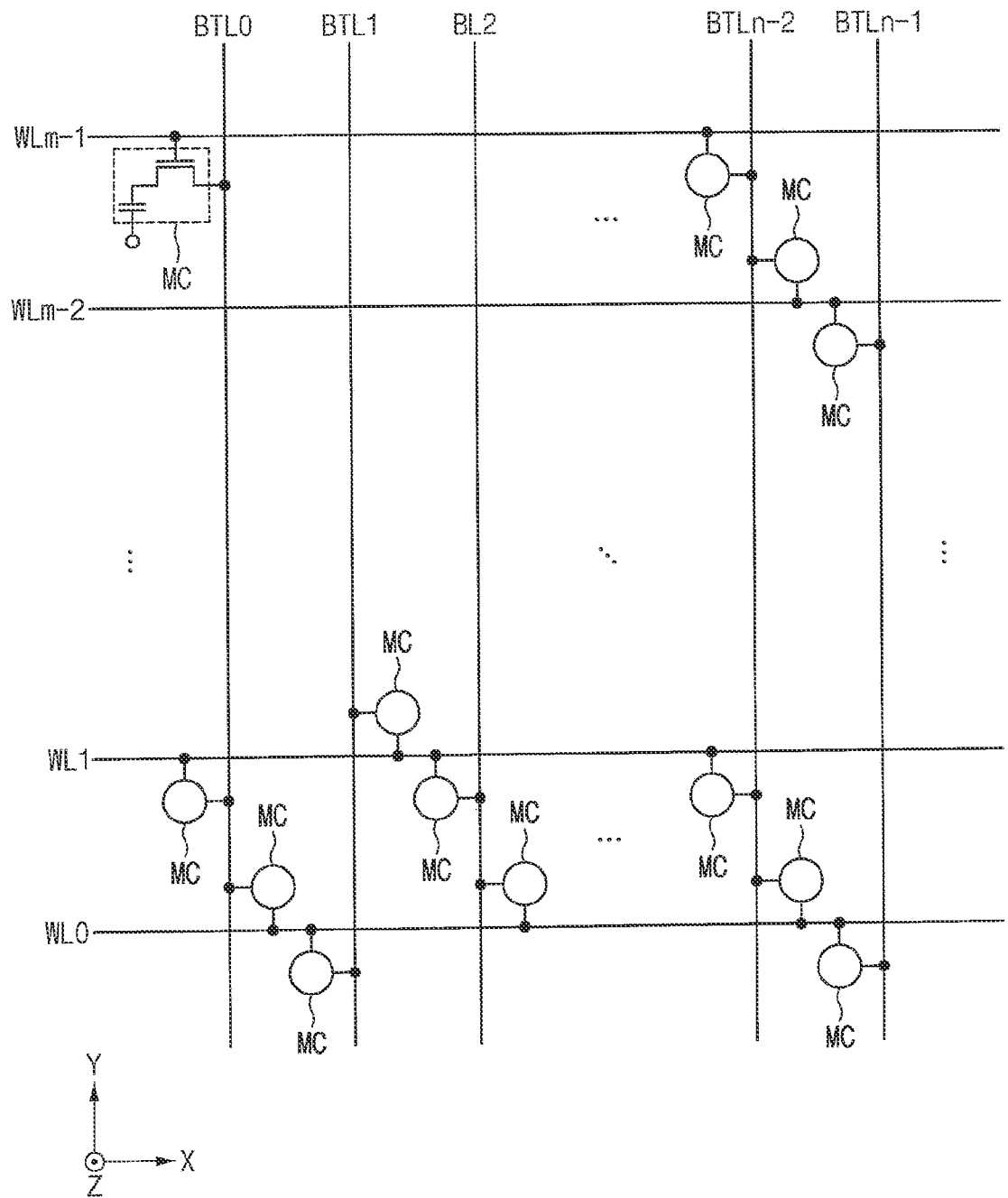
FIG. 15 is a partial diagram of a bank array included in the semiconductor memory device of FIG. 14.

FIG. 15 is a conceptual diagram illustrating a partial bank array 480a that may be included in the semiconductor memory device of FIG. 14.

Referring to FIG. 15, the first bank array 480a may include a plurality of wordlines WL0~WLm−1, where m is an even integer equal to or greater than two, a plurality of bitlines BTL0~BTLn−1, where n is an even integer equal to or greater than two, and a plurality of memory cells MC disposed at intersections between the wordlines WL0~WLm−1 and the bitlines BTL0~BTLn−1.

In some embodiments, each of the memory cells MC may include DRAM cell. The arrangement of the plurality of memory cells MC may differ in response to whether a memory cell MC is coupled to an even wordline (for example, wordline WL0) or to an odd wordline (for example, wordline WL1). For example, a bitline coupled to adjacent memory cells MC may be selected in response to whether a wordline selected by an access address is an even wordline or an odd wordline.

FIGS. 16 and 17 are conceptual diagrams respectively illustrating row and column commands associated with a semiconductor memory device according to embodiments of the inventive concept.

Referring to FIGS. 1 and 16, in some embodiments, the VM 400 of the semiconductor memory device 10 may be a high bandwidth memory (HBM) device. Accordingly, FIG. 16 assumes the use of; a row no operation command RNOP, an active or activate command ACT, a power-down entry command PDE, a self-refresh entry command SRE, a power-down exit command PDX, and a self-refresh exit command SRX. And FIG. 17 assumes the use of; a column no operation command CNOP, a read command RD, a write command WR, and mode register set command MRS, which correspond to column commands according to the HBM standards. (In this regard, those skilled in the art will recognize that HBM devices may use a number of different row and column commands).

Referring to FIGS. 16 and 17, the commands and the addresses as described above may include a plurality of row CA signals R0~R9 and a plurality of column CA signals C0~C7. Commands and addresses communicated from the host device to the HBM device may be represented by a combination of the row CA signals R0~R9 and the column CA signals C0-C7. 'H' indicates a logic high level, 'L' indicates a logic low level, RA0~RA15 indicate bits of a row address, BA0~BA3 indicate bits of a bank address, 'V' indicates any of the logic high level or the logic low level, CA0~CA4 indicate bits of a column address, SID indicates an identifier of a memory semiconductor die, and PC indicates a pseudo-channel.

For example, the active command ACT may be communicated during 1.5 clock cycles including two rising edges R and one falling edge F, whereas the read command RD and the write command WR may be communicated during one clock cycle. The active command ACT may include the bank address bits BA0~BA3 and the row address bits RA0~RA15. The read command RD and the write command WR may include the bank address bits BA0~BA3 and the column address bits CA0~CA4.

Combinations of the command-address signal shown in FIGS. 16 and 17 are non-limiting examples, and various combinations may be utilized.

In some embodiments, the volatile memory device (e.g., VM 400) included in the semiconductor memory device 10 may be a low power double data rate 4 (LPDDR4) or LPDDR5 DRAM device. In such cases, the commands and the addresses may be represented by combinations of a chip selection signal and command-address signals.

In some embodiments, the volatile memory device (e.g., VM 400) included in the semiconductor memory device 10 may be a double data rate 4 (DDR4) DRAM device. In such a case, the commands may be represented by combinations of a plurality of command signals and the addresses may be represented by combination of address signals.

Figure 18:
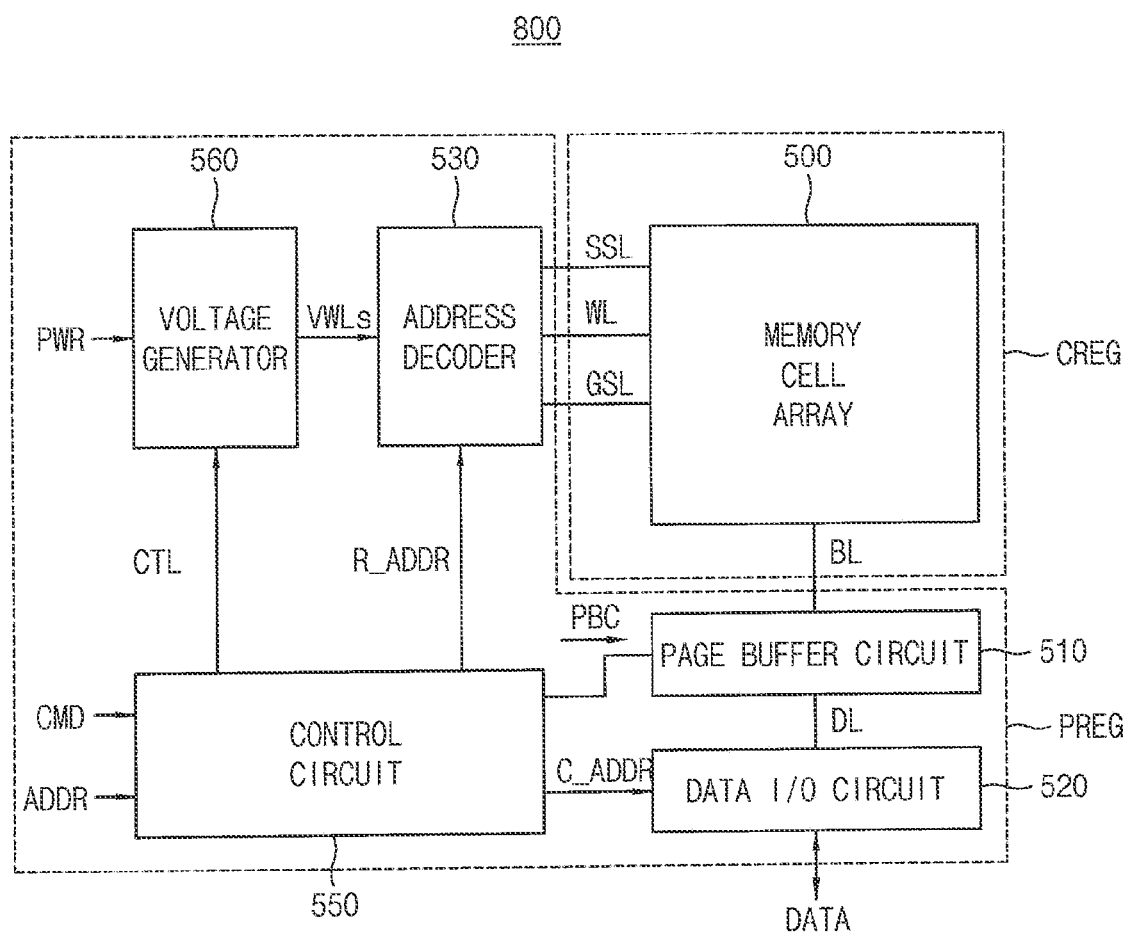
FIG. 18 is a block diagram illustrating a nonvolatile memory device included in a test chip according to embodiments of the inventive concept.

FIG. 18 is a block diagram further illustrating in one example the NVM 800 included in a test chip 200 of FIG. 1.

Referring to FIG. 18, the NVM 800 may include a memory cell array 500, a page buffer circuit 510, a data I/O circuit 520, an address decoder 530, a control circuit 550, and a voltage generator 560. In some embodiments, the NVM 800 may have a cell over periphery (COP) structure in which a memory cell array is arranged over peripheral circuits. In such a case, the memory cell array 500 may be formed in a cell region CREG, and the page buffer circuit 510, the data I/O circuit 520, the address decoder 530, the control circuit 550, and the voltage generator 560 may be formed in a peripheral region PREG The memory cell array 500 may be coupled to the address decoder 530 through string selection lines SSL, wordlines WL, and ground selection lines GSL. The memory cell array 500 may be coupled to the page buffer circuit 510 through a bitlines BL. The memory cell array 500 may include memory cells coupled to the wordlines WL and the bitlines BL. In some embodiments, the memory cell array 500 may be a three-dimensional memory cell array, which may be formed on a substrate in a three-dimensional structure (or a vertical structure). In this case, the memory cell array 500 may include cell strings (e.g., NAND strings) that are vertically oriented such that at least one memory cell is located over another memory cell.

The control circuit 550 may receive a command signal CMD and an address signal ADDR from a memory controller, and may control erase, program, and read operations of the NVM 800 in response to (or based on) at least one of the command signal CMD and the address signal ADDR. The erase operation may include performing a sequence of erase loops, and the program operation may include performing a sequence of program loops. Each program loop may include a program operation and a program verification operation. Each erase loop may include an erase operation and an erase verification operation. The read operation may include a normal read operation and data recover read operation.

In some embodiments, the control circuit 550 may generate a control signals CTL used to control the operation of the voltage generator 560, and may generate a page buffer control signal PBC for controlling the page buffer circuit 510, in response to the command signal CMD, and may generate a row address R_ADDR and a column address C_ADDR in response to the address signal ADDR. The control circuit 550 may provide the row address R_ADDR to the address decoder 530, and may provide the column address C_ADDR to the data I/O circuit 520.

The address decoder 530 may be coupled to the memory cell array 500 through the string selection lines SSL, the wordlines WL, and the ground selection lines GSL. During the program operation or the read operation, the address decoder 530 may determine (or select) one of the wordlines WL as a selected wordline, and may determine or designate the remaining wordlines WL other than the selected wordline as unselected wordlines in response to the row address R_ADDR.

In addition, during the program operation or the read operation, the address decoder 530 may determine one of the string selection lines SSL as a selected string selection line and determine or designate the remaining the string selection lines SSL other than the selected string selection line as unselected string selection lines in response to the row address R_ADDR.

The voltage generator 560 may generate wordline voltages VWL, which are used for the operation of the memory cell array 500 of the NVM 800, in response to the control signals CTL. The voltage generator 560 may receive the power PWR from the memory controller. The wordline voltages VWL may be applied to the wordlines WL through the address decoder 530.

In some embodiments, during the erase operation, the voltage generator 560 may apply an erase voltage to a well and/or a common source line of a memory block, and may apply an erase permission voltage (e.g., a ground voltage) to all of the wordlines of the memory block or a portion of the wordlines in response to an erase address. During the erase verification operation, the voltage generator 560 may apply an erase verification voltage simultaneously to all of the wordlines of the memory block or sequentially (e.g., one by one) to the wordlines.

In some embodiments, during the program operation, the voltage generator 560 may apply a program voltage to the selected wordline, and may apply a program pass voltage to the unselected wordlines. During the program verification operation, the voltage generator 560 may apply a program verification voltage to the first wordline, and may apply a verification pass voltage to the unselected wordlines.

During the normal read operation, the voltage generator 560 may apply a read voltage to the selected wordline, and may apply a read pass voltage to the unselected wordlines. During the data recover read operation, the voltage generator 560 may apply the read voltage to a wordline adjacent to the selected wordline, and may apply a recover read voltage to the selected wordline.

The page buffer circuit 510 may be coupled to the memory cell array 500 through the bitlines BL. The page buffer circuit 510 may include multiple buffers. In some embodiments, each buffer may be connected to only a single bitline. In some embodiments, each buffer may be connected to two or more bitlines. The page buffer circuit 510 may temporarily store data to be programmed in a selected page or data read out from the selected page of the memory cell array 500.

The data I/O circuit 520 may be coupled to the page buffer circuit 510 through data lines DL. During the program operation, the data I/O circuit 520 may receive program data DATA received from the memory controller and provide the program data DATA to the page buffer circuit 510 in response to the column address C_ADDR received from the control circuit 550. During the read operation, the data I/O circuit 520 may provide read data DATA, having been read from the memory cell array 500 and stored in the page buffer circuit 510, to the memory controller in response to the column address C_ADDR received from the control circuit 550.

The page buffer circuit 510 and the data I/O circuit 520 may read data from a first area of the memory cell array 500, and may write this read data to a second area of the memory cell array 500 (e.g., without communicating data to a source external to the NVM 800, such as to the memory controller). Thus, the page buffer circuit 510 and the data I/O circuit 520 may perform a copy-back operation.

Figure 19:
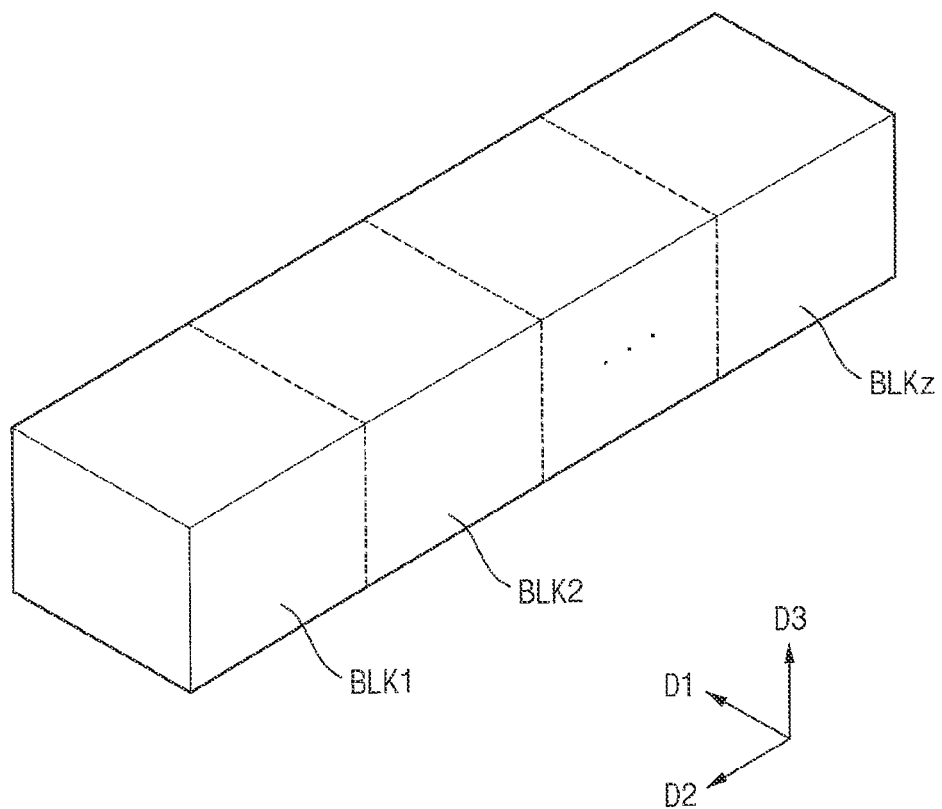
FIG. 19 is a perspective diagram illustrating a memory cell array included in the nonvolatile memory device of FIG. 18.
Figure 20:
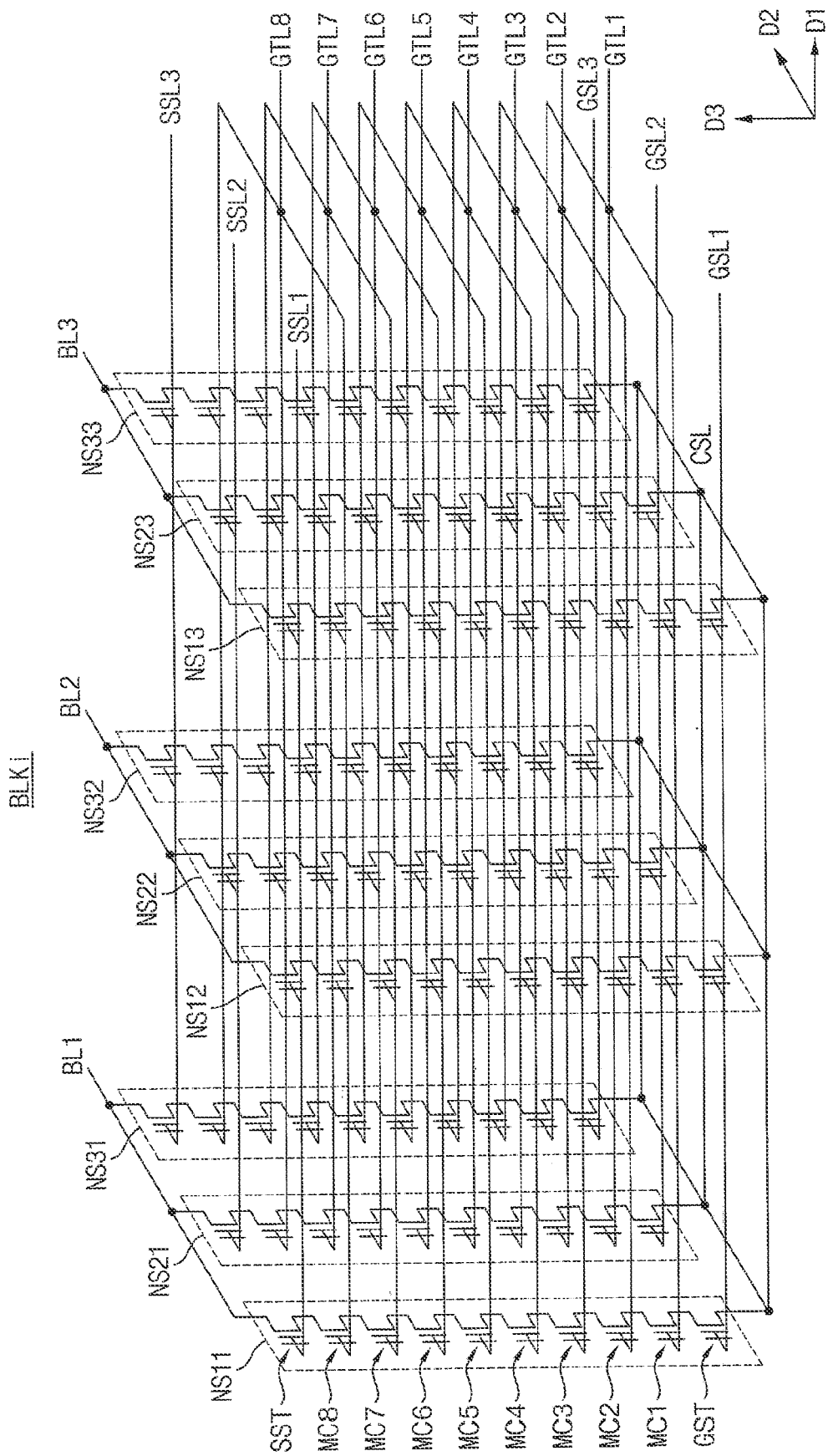
FIG. 20 is a partial, equivalent circuit diagram for a memory block included in the memory cell array of FIG. 19.

FIG. 19 is a perspective diagram illustrating a memory cell array that may be included in the NVM 800 of FIG. 18, and FIG. 20 is a partial, equivalent circuit diagram of a memory block included in the memory cell array of FIG. 19.

Referring to FIG. 19, the memory cell array 500 may include memory blocks BLK1 to BLKz. In some embodiments, the memory blocks BLK1 to BLKz may be selected by the address decoder 530 of FIG. 18. For example, the address decoder 530 may select a particular memory block BLK corresponding to a block address among the memory blocks BLK1 to BLKz.

A memory block BLKi of FIG. 20 may be formed on a substrate in a three-dimensional structure (or a vertical structure). For example, NAND strings or cell strings included in the memory block BLKi may be formed in a vertical direction D3 perpendicular to an upper surface of a substrate.

Referring to FIG. 20, the memory block BLKi may include NAND strings NS11 to NS33 coupled between bitlines BL1, BL2, and BL3 and a common source line CSL. Each of the NAND strings NS11 to NS33 may include a string selection transistor SST, a memory cells MC1 to MC8, and a ground selection transistor GST. In FIG. 20, each of the NAND strings NS11 to NS33 is illustrated to include eight memory cells MC1 to MC8. However, embodiments of the inventive concept are not limited thereto, and each of the NAND strings NS11 to NS33 may include various numbers of memory cells.

Each string selection transistor SST may be connected to a corresponding string selection line (one of SSL1 to SSL3). The memory cells MC1 to MC8 may be connected to corresponding gate lines GTL1 to GTL8, respectively. The gate lines GTL1 to GTL8 may be wordlines, and some of the gate lines GTL1 to GTL8 may be dummy wordlines. Each ground selection transistor GST may be connected to a corresponding ground selection line (one of GSL1 to GSL3). Each string selection transistor SST may be connected to a corresponding bitline (e.g., one of BL1, BL2, and BL3), and each ground selection transistor GST may be connected to the common source line CSL.

Wordlines (e.g., WL1) having the same or similar height may be commonly connected, and the ground selection lines GSL1 to GSL3 and the string selection lines SSL1 to SSL3 may be separated. In FIG. 20, the memory block BLKi is illustrated as being coupled to eight gate lines GTL1 to GTL8 and three bitlines BL1 to BL3. However, embodiments of the inventive concept are not limited thereto, and each memory block in the memory cell array 500 may be coupled to various numbers of wordlines and various numbers of bitlines.

Figure 21:
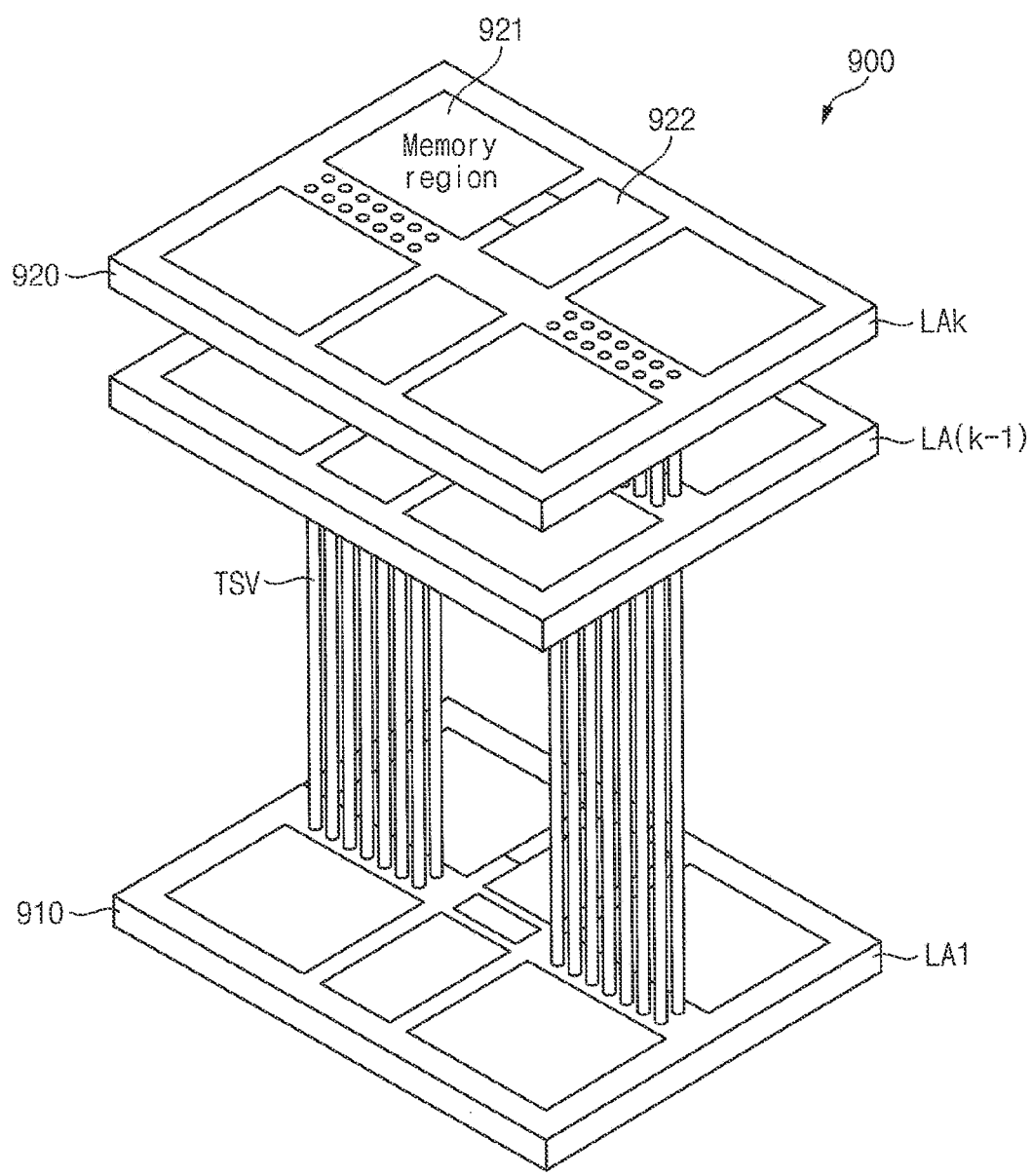
FIGS. 21 and 22 are respective diagrams illustrating a stacked memory device according to embodiments of the inventive concept.
Figure 22:
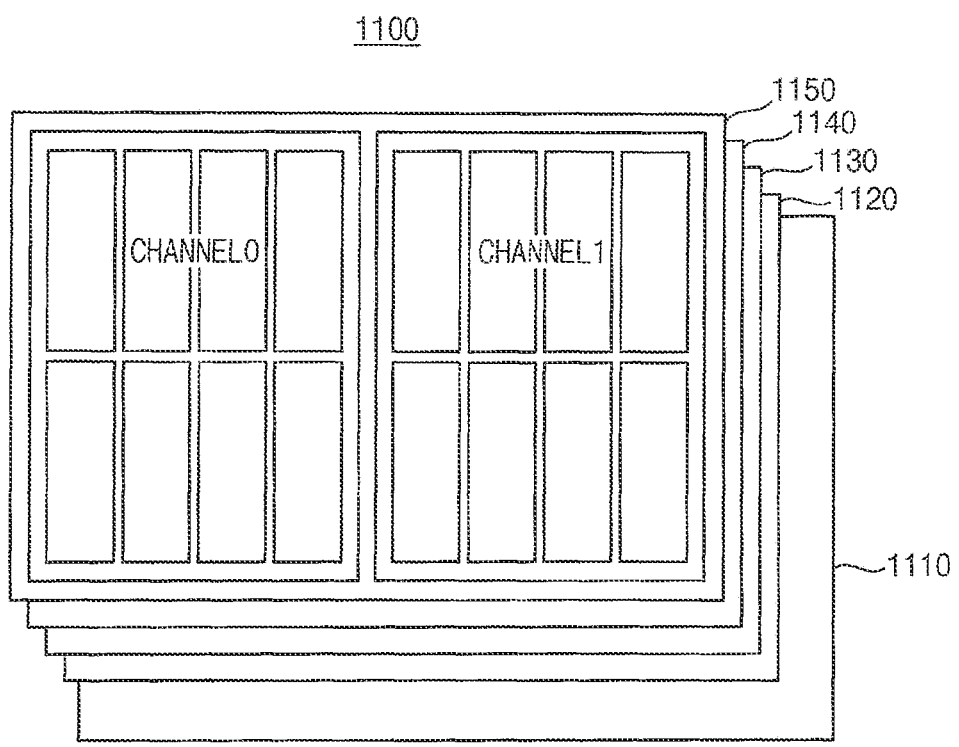

FIGS. 21 and 22 are respective diagrams illustrating a vertically stacked memory device according to embodiments of the inventive concept.

Referring to FIG. 21, a semiconductor memory device 900 may include first through kth semiconductor integrated circuit layers LA1 through LAk, in which the lowest first semiconductor integrated circuit layer LA1 is assumed to be an interface or control chip and the other semiconductor integrated circuit layers LA2 through LAk are assumed to be slave chips including core memory chips. The slave chips may form a plurality of memory ranks as described above.

The first through kth semiconductor integrated circuit layers LA1 through LAk may communicate signals between the layers by through-substrate vias TSVs (e.g., through-silicon vias). The lowest first semiconductor integrated circuit layer LA1 as the interface or control chip may communicate with an external memory controller through a conductive structure formed on an external surface.

Each of the first semiconductor integrated circuit layer 910 LA1 through the kth semiconductor integrated circuit layer 920 LAk may include memory regions 921 and peripheral circuits 922 for driving the memory regions 921. For example, the peripheral circuits 922 may include a row-driver for driving wordlines of a memory, a column-driver for driving bitlines of the memory, a data I/O circuit for controlling input and output of data, a command buffer for receiving a command from an outside source and buffering the command, and an address buffer for receiving an address from an outside source and buffering the address.

The first semiconductor integrated circuit layer 910 may further include a control circuit. The control circuit may control access to the memory region 921 in response to a command and an address signal from a memory controller and may generate control signals for accessing the memory region 921.

Each of the semiconductor integrated circuit layers LA2 through LAk corresponding to the slave layer may include a configuration to control the load of the global I/O lines as described above.

FIG. 22 illustrates one possible configuration of a high bandwidth memory (HBM). Referring to FIG. 22, the HBM 1100 may have a stack of multiple DRAM semiconductor dies 1120, 1130, 1140, and 1150. The HBM of the stack structure may be optimized by a plurality of independent interfaces called channels. Each DRAM stack may support up to 8 channels in accordance with the HBM standards. FIG. 22 shows an example stack containing 4 DRAM semiconductor dies 1120, 1130, 1140, and 1150 and each DRAM semiconductor die supports two channels CHANNEL0 and CHANNEL1.

Each channel provides access to an independent set of DRAM banks. Requests from one channel may not access data attached to a different channel. Channels are independently clocked, and need not be synchronous.

The HBM 1100 may further include an interface die 1110 or a logic die at bottom of the stack structure to provide signal routing and other functions. Some function for the DRAM semiconductor dies 1120, 1130, 1140, and 1150 may be implemented in the interface die 1110.

Each of the DRAM semiconductor dies 1120, 1130, 1140, and 1150 may include a configuration to control the load of the global I/O lines as described above.

Figure 23:
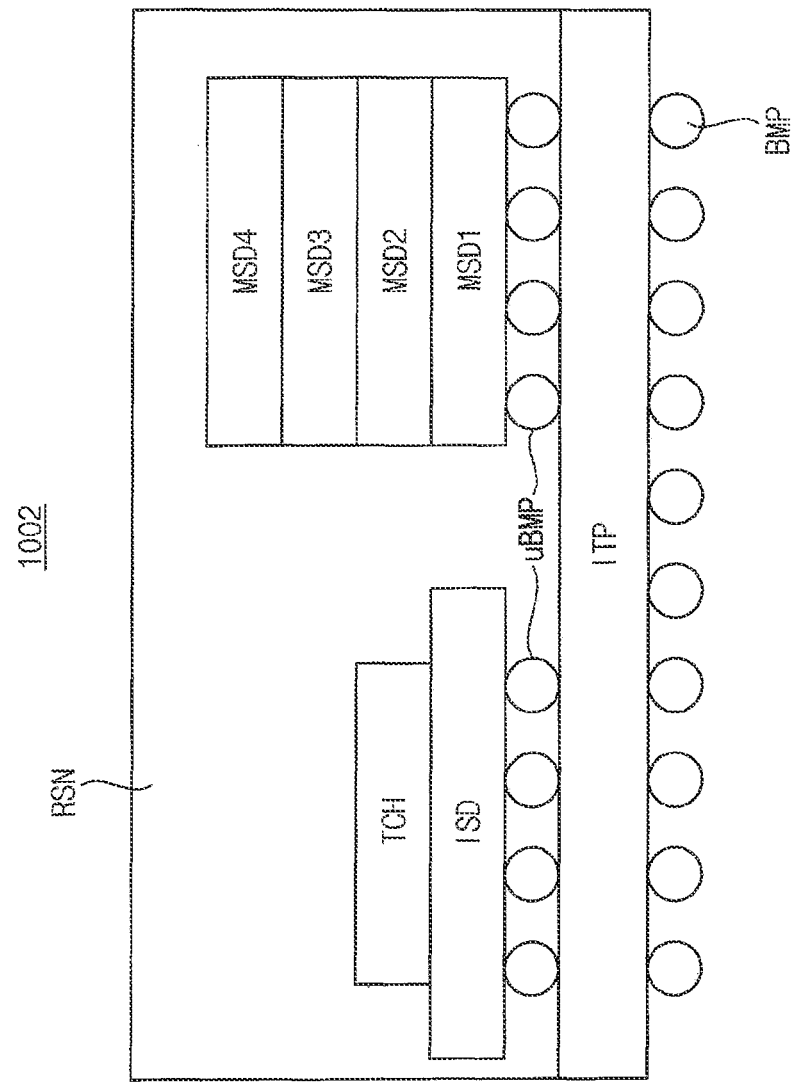
FIGS. 23 and 24 are diagrams illustrating packaging structures of a stacked memory device according to embodiments of the inventive concept.
Figure 24:
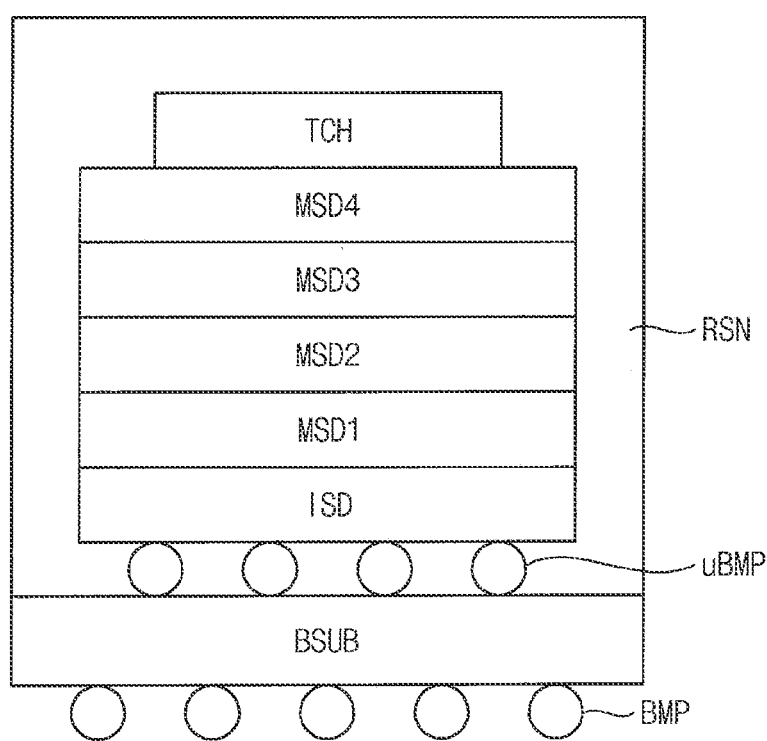

FIGS. 23 and 24 are cross-sectional diagrams illustrating packaging structures for a vertically stacked memory device according to embodiments of the inventive concept.

Referring to FIG. 23, a memory chip 1002 may include an interposer ITP, a stacked memory device and a test chip TCH stacked on the interposer ITP. The stacked memory device may include an interface semiconductor die ISD and a plurality of memory semiconductor dies MSD1, MSD2, MSD3 and MSD4 (hereafter collectively, "MSD1~MSD4"). The test chip TCH may be stacked on the interface semiconductor die ISD.

Referring to FIG. 24, a memory chip 1003 may include a base substrate BSUB, a stacked memory device and a test chip TCH stacked on the base substrate BSUB. The stacked memory device may include an interface semiconductor die ISD and a plurality of memory semiconductor dies MSD1~MSD4. The test chip TCH may be stacked on the plurality of memory semiconductor dies MSD1~MSD4.

FIG. 23 illustrates a structure in which the memory semiconductor dies MSD1~MSD4, except for the interface semiconductor die ISD, are vertically stacked and the interface semiconductor die ISD is electrically connected to the memory semiconductor dies MSD1~MSD4 through the interposer ITP or a base substrate. In contrast, FIG. 24 illustrates a structure in which the interface semiconductor die ISD is vertically stacked with the memory semiconductor dies MSD1~MSD4.

As described above, the test chip TCH may include test I/O pads respectively connected to memory I/O pads and a nonvolatile memory device. The test chip TCH may, in the normal mode, store log information corresponding to the commands and the addresses in the nonvolatile memory device. The test chip TCH may, in the debugging mode, read the log information from the nonvolatile memory device to output the log information through test data pads among the test I/O pads.

The base substrate BSUB may be the same as the interposer ITP or may include the interposer ITP. The base substrate BSUB may be a PCB. External connecting elements such as conductive bumps BMP may be formed on a lower surface of the base substrate BSUB, and internal connecting elements such as conductive bumps uBMP may be formed on an upper surface of the base substrate BSUB. In the example embodiment of FIG. 25, the interface semiconductor die ISD and the memory semiconductor dies MSD1~MSD4 may be electrically connected through the through-silicon vias. The stacked semiconductor dies BSD and MSD1~MSD4 may be packaged using resin RSN.

Figure 25:
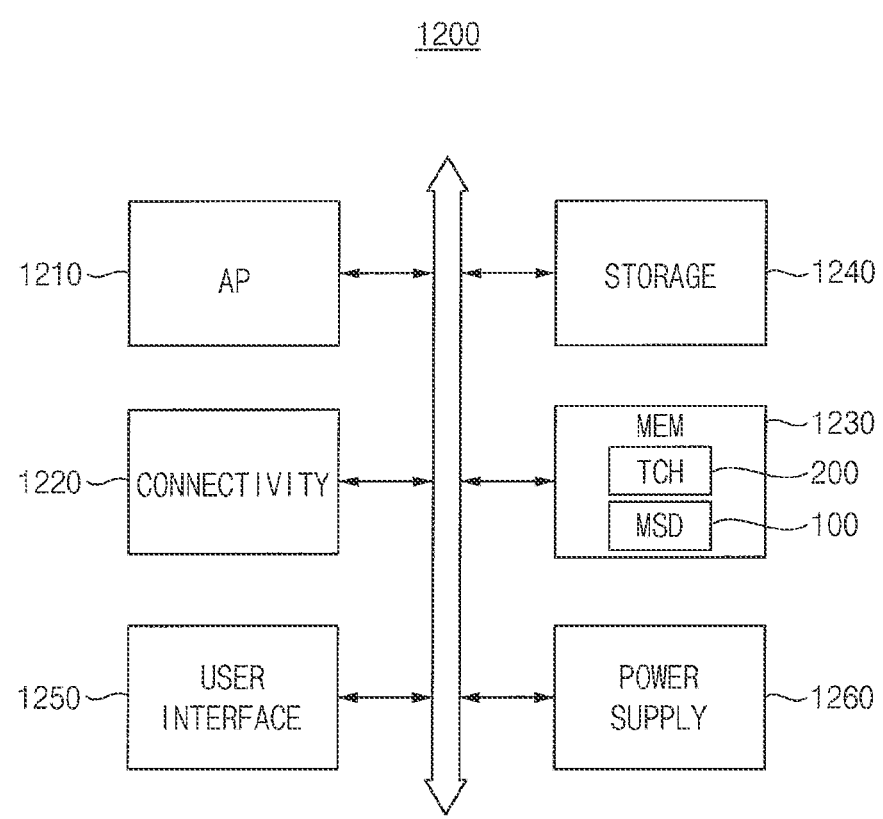
FIG. 25 is a block diagram illustrating a mobile system according to embodiments of the inventive concept.

FIG. 25 is a block diagram illustrating a mobile system 1200 according to embodiments of the inventive concept.

Referring to FIG. 25, the mobile system 1200 includes an application processor (AP) 1210, a connectivity unit 1220, a semiconductor memory device 1230, a storage device 1240, a user interface 1250, and a power supply 1260. In some embodiments, the mobile system 1200 may be, for example, a mobile phone, a smart phone, a personal digital assistant (PDA), a portable multimedia player (PMP), a digital camera, a music player, a portable game console, a navigation system, or another type of electronic device.

The application processor 1210 may execute applications, e.g., a web browser, a game application, a video player, etc. The connectivity unit 1220 may perform wired or wireless communication with an external device. The semiconductor memory device 1230 may store data processed by the application processor 1210 or may operate as a working memory. The storage device 1240 may store a boot image for booting the mobile system 1200. The user interface 1250 may include at least one input device, such as a keypad, a touch screen, etc., and at least one output device, such as a speaker, a display device, etc. The power supply 1260 may be used to supply one or more power supply voltage(s) to the mobile system 1200.

In some embodiments, the semiconductor memory device 1230 may include a memory semiconductor die MSD100 including a volatile memory device and a test chip TCH 200. Consistent with the foregoing description, the test chip 200 may include test I/O pads respectively connected to memory I/O pads, as well as a nonvolatile memory device. The test chip 200 may, in the normal mode, store log information (e.g., information corresponding to received command/address) in the nonvolatile memory device. The test chip 200 may, in a debugging mode, read the log information from the nonvolatile memory device and provide (or output) log information (e.g., all or some portion of the log information) through test data pads among the test I/O pads to one or more external circuits (e.g., a host device).

Consistent with the foregoing description, semiconductor memory devices and methods providing log information according to embodiments of the inventive concept may efficiently provide log information without adversely influencing (e.g., delaying) normal operations performed by the volatile memory device by the use of the test chip to receive and store log information (e.g., command/address). As a result, system operating analysis and related debugging may be more efficiently performed in relation to the log information provided by the test chip.

Embodiments of the inventive concept may be variously applied to semiconductor memory devices and memory systems including same. For example, the embodiments of the inventive concept may be variously applied to systems, such as for example, a memory card, a solid state drive (SSD), an embedded multimedia card (eMMC), a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, a server system, an automotive device, etc.

Those skilled in the art will appreciate that the foregoing embodiments of the inventive concept are illustrative and that the scope of the inventive concept is not limited thereto. Although several embodiments of the inventive concept have been described in detail, those skilled in the art will further appreciate that many modifications may be made to these embodiments without materially departing from the scope of the inventive concept, as defined by the following claims.

What is claimed is:

1. A semiconductor memory device comprising:
    a memory semiconductor die connected to a host device and including a volatile memory device and memory input/output pads, wherein the volatile memory device is configured to perform a normal operation in response to at least one of a command and an address received in a normal mode from the host device through memory control pads among the memory input/output pads; and
    a test chip including a nonvolatile memory device and test input/output pads respectively connected to the memory input/output pads,
    wherein, in the normal mode the test chip is configured to store log information in the nonvolatile memory device,
    wherein, in a debugging mode the test chip is configured to read the log information from the nonvolatile memory device and output the log information through test data pads among the test input/output pads, wherein the log information includes information corresponding to the at least one of the command and the address received by the semiconductor memory device from the host device,
wherein the memory semiconductor die and the test chip are distinct from each other and are vertically stacked, and
wherein the memory semiconductor die and the test chip respectively enter the debugging mode based on a mode set register (MRS) command including mode information received from the host device.

2. The semiconductor memory device of claim 1, wherein the memory semiconductor die and the test chip are vertically stacked and packaged as a single semiconductor chip.

3. The semiconductor memory device of claim 1, wherein in the normal mode, the test chip is further configured to store the log information independent of the performing of the normal operation by the volatile memory device.

4. The semiconductor memory device of claim 1, wherein in the debugging mode, the volatile memory device stops the normal operation in response to the at least one of a command and an address, and the test chip is further configured to read the log information from the nonvolatile memory device and provide the log information through the test data pads.

5. The semiconductor memory device of claim 1,
wherein the volatile memory device includes a mode register configured to store control values that control operation of the volatile memory device, and
wherein the volatile memory device is configured to receive a mode register set command including mode information indicating one of the normal mode and the debugging mode, store the mode information in the mode register, and operate in one of the normal mode and the debugging mode in response to the mode information stored in the mode register.

6. The semiconductor memory device of claim 1, wherein the test chip further includes a buffer memory configured to temporarily store the log information.

7. The semiconductor memory device of claim 6,
wherein the buffer memory is further configured to communicate the log information to the nonvolatile memory device according to a page unit, and
wherein the nonvolatile memory device performs program operations according to the page unit.

8. The semiconductor memory device of claim 6,
wherein, upon powering off the semiconductor memory device in the normal mode, the buffer memory is further configured to communicate residual log information stored in the buffer memory to the nonvolatile memory device, and
wherein the test chip is powered off after the residual log information is stored in the nonvolatile memory device.

9. The semiconductor memory device of claim 1, wherein the test chip further includes an error correction code (ECC) engine configured to encode the log information, store encoded log information in the nonvolatile memory device, and decode the encoded log information read from the nonvolatile memory device.

10. The semiconductor memory device of claim 1,
wherein the test chip further includes a timer configured to provide time information, and
wherein the test chip is further configured to store a time stamp corresponding to the time information as a portion of the log information for each one of the at least one of a command and an address.

11. The semiconductor memory device of claim 1, wherein the test chip is further configured to generate a mapping table including mapping relationships between logical addresses of the host device and physical addresses of the nonvolatile memory device.

12. The semiconductor memory device of claim 11, wherein the test chip is further configured to provide a corresponding physical address to the nonvolatile memory device according to the mapping table in response to each read command and each write command among the at least one of a command and an address.

13. The semiconductor memory device of claim 11, wherein the test chip is further configured to stop storing of the log information upon determining in relation to the mapping table that storage space of the nonvolatile memory device is insufficient to store additional log information.

14. The semiconductor memory device of claim 11, wherein the test chip is further configured to store the mapping table in the nonvolatile memory device before powering off of the semiconductor memory device, and read the mapping table from the nonvolatile memory device upon powering on of the semiconductor memory device.

15. The semiconductor memory device of claim 1, wherein the test data pads are respectively connected to memory data pads among the memory input/output pads, and the test chip is further configured to store at least a portion of data received through the test data pads in the normal mode, as a portion of the log information.

16. The semiconductor memory device of claim 1, wherein the volatile memory device is configured to activate the memory control pads and memory data pads among the memory input/output pads in the normal mode, and activate the memory control pads and deactivate the memory data pads in the debugging mode.

17. The semiconductor memory device of claim 1, wherein the test chip is further configured to activate test control pads among the test input/output pads and deactivate the test data pads in the normal mode, and activate the test control pads and the test data pads in the debugging mode.

18. A semiconductor memory device comprising:
a memory semiconductor die including a volatile memory device configured to perform a normal operation in response to at least one of a command and an address received from a host device; and
a test chip vertically stacked with the memory semiconductor die and including a nonvolatile memory device,
wherein the test chip is configured, in a normal mode, during the normal operation of the volatile memory device, to store log information corresponding to the at least one of the command and the address received by the semiconductor memory device from the host device, and configured, in a debugging mode, to read the log information from the nonvolatile memory device and to initialize the nonvolatile memory device by performing an erase operation on the nonvolatile memory device in response to a reset command communicated from the host device.

19. A method of providing log information, the method comprising:
in a normal mode of operating a volatile memory device, performing a normal operation by the volatile memory device included in a memory semiconductor die in response to at least one of a command and an address received from a host device, and storing log information in a nonvolatile memory device included in a test chip, wherein the log information corresponds to the at least one of the command and the address received from the host device;

in a debugging mode of operating the volatile memory device, stopping the normal operation of the volatile memory device and reading the log information from the nonvolatile memory device; and in the debugging mode of operating the volatile memory device, performing an erase operation on the test chip in response to a reset command communicated from the host device.

* * * * *